United States Patent
Awaji

(10) Patent No.: US 7,504,591 B2
(45) Date of Patent: Mar. 17, 2009

(54) ELECTROMAGNETIC SHIELDING GASKET AND ELECTRONIC DEVICE PROVIDED THEREWITH

(75) Inventor: Teizou Awaji, Yao (JP)

(73) Assignee: Uber Co., Ltd., Osaka (JP)

(*) Notice: Subject to any disclaimer, the term of this patent is extended or adjusted under 35 U.S.C. 154(b) by 0 days.

(21) Appl. No.: 11/972,507

(22) Filed: Jan. 10, 2008

(65) Prior Publication Data

US 2008/0173475 A1 Jul. 24, 2008

(30) Foreign Application Priority Data

Jan. 23, 2007 (JP) .............................. 2007-012193
Jun. 28, 2007 (JP) .............................. 2007-170201
Sep. 19, 2007 (JP) .............................. 2007-241938

(51) Int. Cl.
*H05K 9/00* (2006.01)
(52) U.S. Cl. ........................ 174/355; 174/368; 174/369; 277/920; 361/800
(58) Field of Classification Search ................. 174/355, 174/368, 369; 361/816, 818, 800; 277/920
See application file for complete search history.

(56) References Cited

U.S. PATENT DOCUMENTS

| | | | | |
|---|---|---|---|---|
| 6,137,052 A | * | 10/2000 | Kurrer et al. | ................. 174/351 |
| 6,204,444 B1 | * | 3/2001 | Pugliese et al. | ............. 174/358 |
| 6,281,433 B1 | * | 8/2001 | Decker et al. | ................ 174/394 |
| 6,291,766 B1 | * | 9/2001 | Komai | ......................... 174/377 |
| 6,320,120 B1 | * | 11/2001 | Van Haaster | ................. 174/369 |
| 6,395,976 B1 | * | 5/2002 | Koradia et al. | ............... 174/359 |
| 6,437,237 B1 | * | 8/2002 | Kurrer et al. | ................. 174/354 |
| 6,483,023 B1 | * | 11/2002 | Jacques | ....................... 174/358 |
| 6,483,024 B1 | * | 11/2002 | Smithson et al. | ........... 174/354 |
| 6,660,932 B1 | * | 12/2003 | Barringer et al. | ............ 174/358 |
| 6,865,092 B2 | * | 3/2005 | Joist et al. | .................... 361/818 |
| 6,906,255 B2 | | 6/2005 | Inoke et al. | |

FOREIGN PATENT DOCUMENTS

JP 2004200444 A 7/2004

* cited by examiner

*Primary Examiner*—Hung V Ngo
(74) *Attorney, Agent, or Firm*—Hogan & Hartson LLP

(57) ABSTRACT

An electromagnetic shielding gasket is provided, which is capable of reducing the amount of projection from the inner surface of a first opposing wall having gasket holding holes and is less likely to come off through the gasket holding holes in the direction from the inner surface side toward the outer surface side of the first opposing wall. A communication device as an electronic device has a device body having a plural number of sub-casings and electromagnetic shielding gaskets 1. A first opposing wall 102a disposed on the sub-casing of the device body includes a plural number of gasket holding holes 104 and gasket guiding holes. The electromagnetic shielding gasket 1 has a gasket body 2 and a plural number of fitting parts 4 and come-off stopping parts 3. The fitting parts 4 are guided in the gasket guiding holes and then fitted in the gasket holding holes. The come-off stopping parts 3 are formed not to come off through the gasket holding holes 104 in the direction from the inner surface side to the outer surface side of the front wall 102a even if they deform under external forces.

10 Claims, 16 Drawing Sheets

Fig. 2A
Fig. 2B
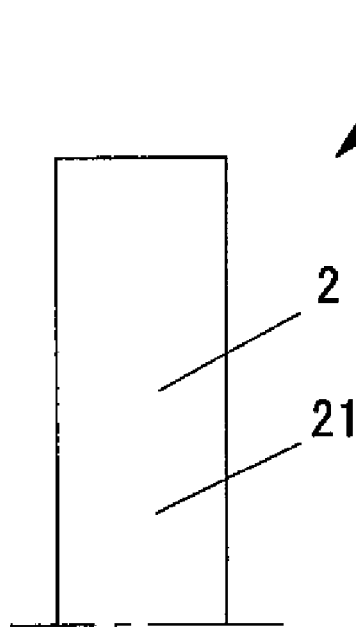
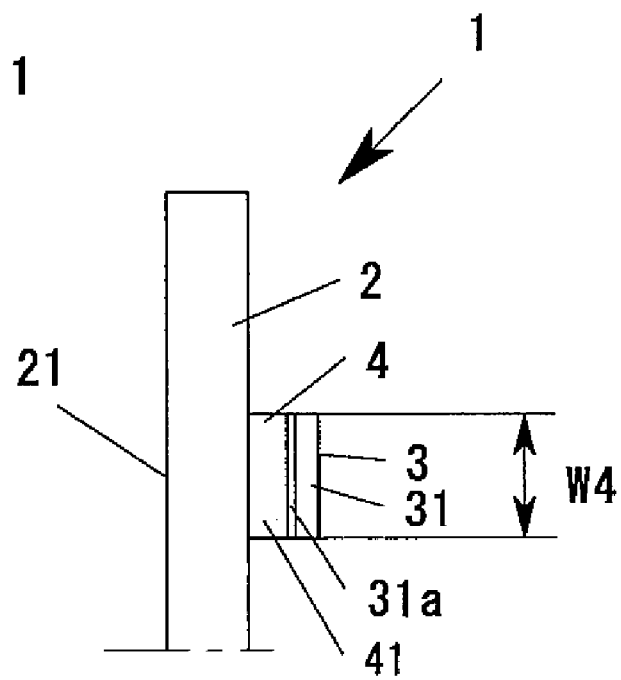
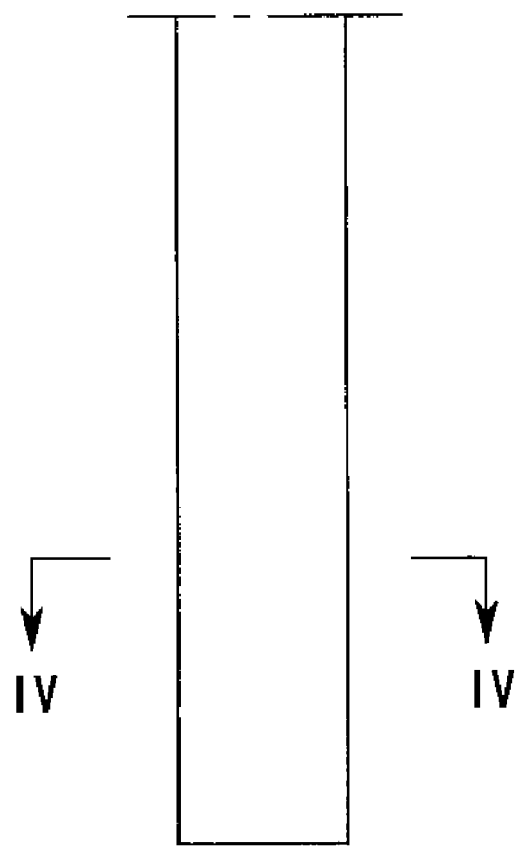
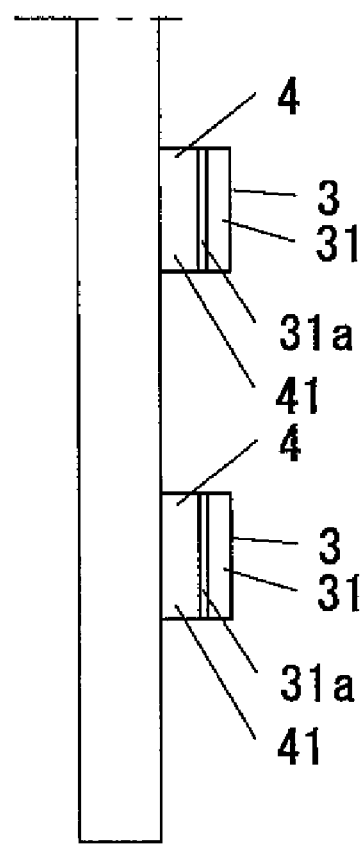

Fig. 3
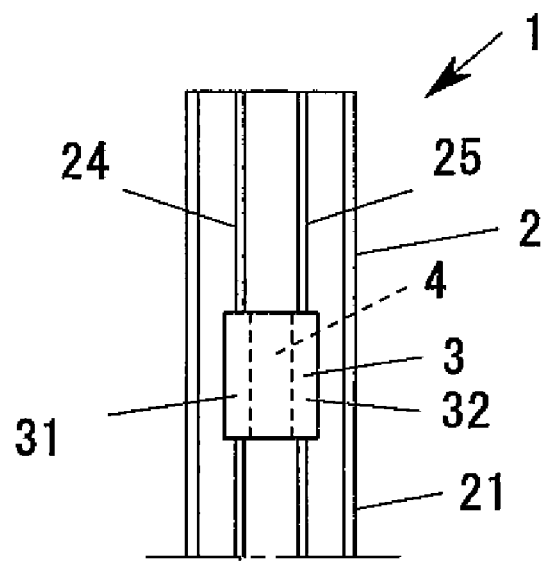
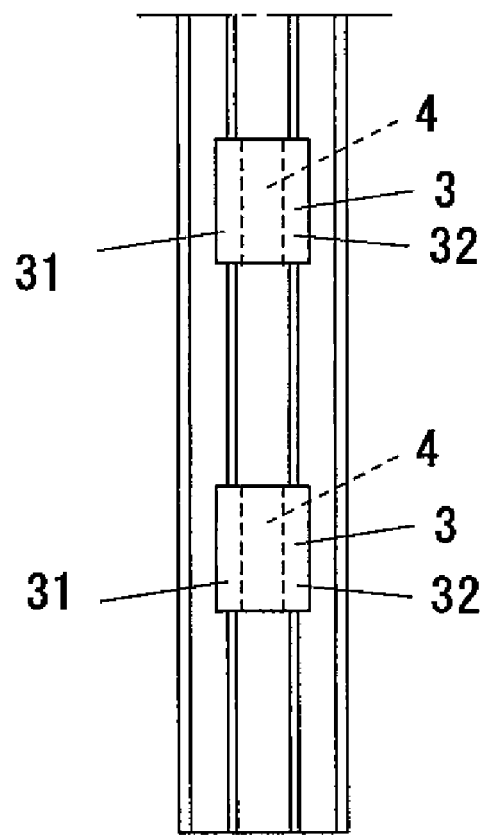

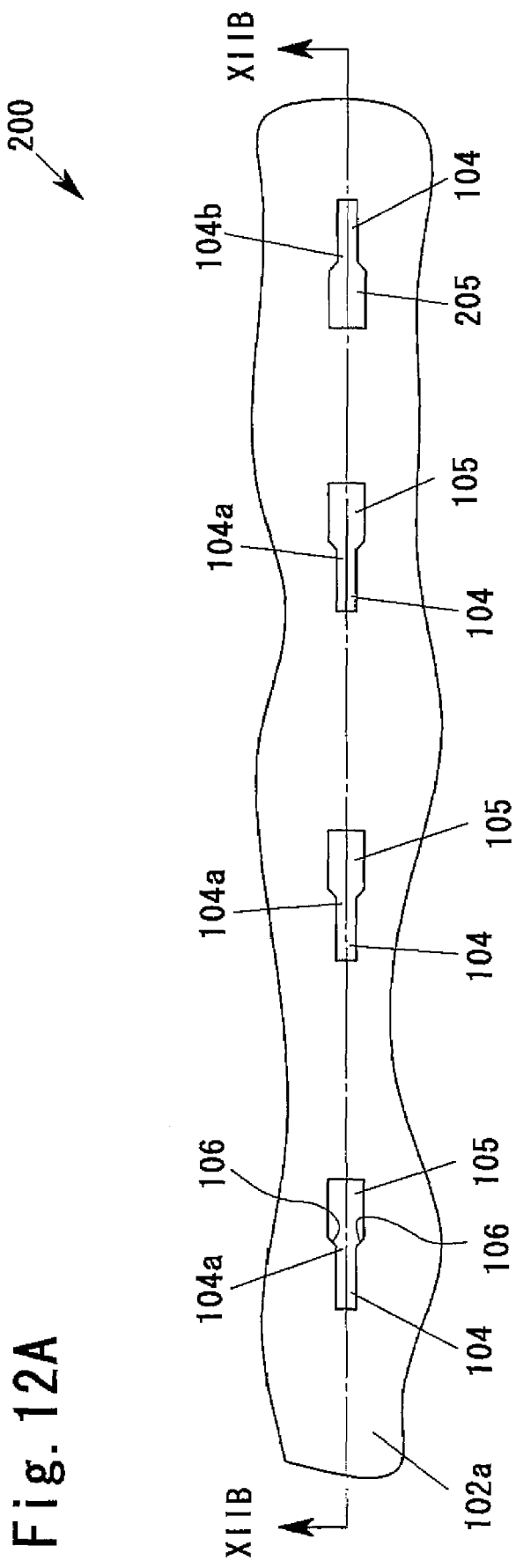
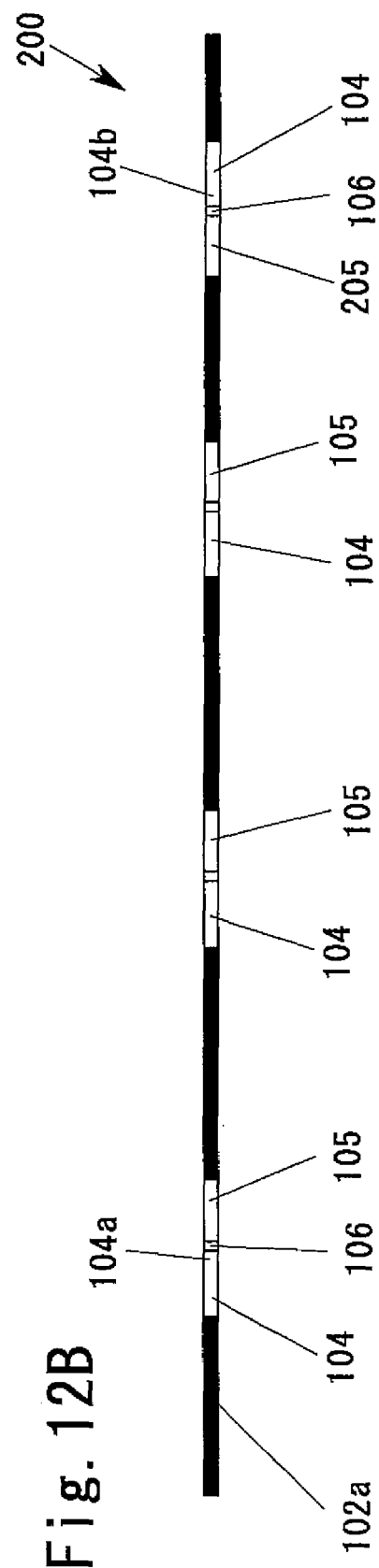
Fig. 12A
Fig. 12B

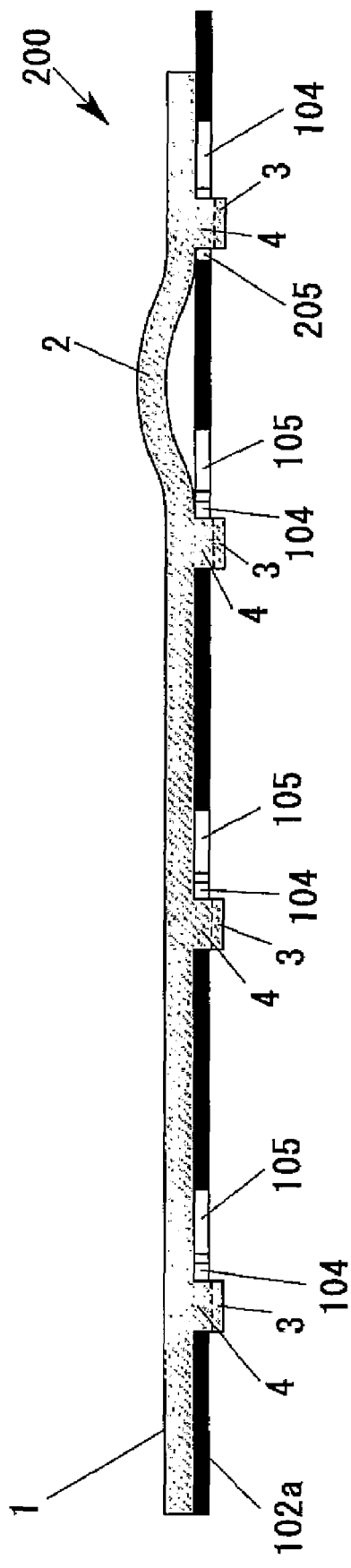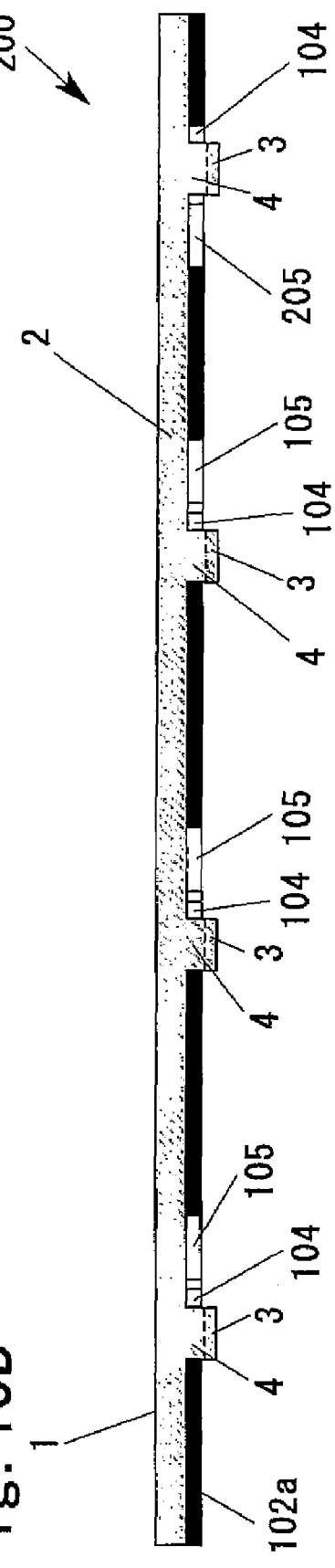

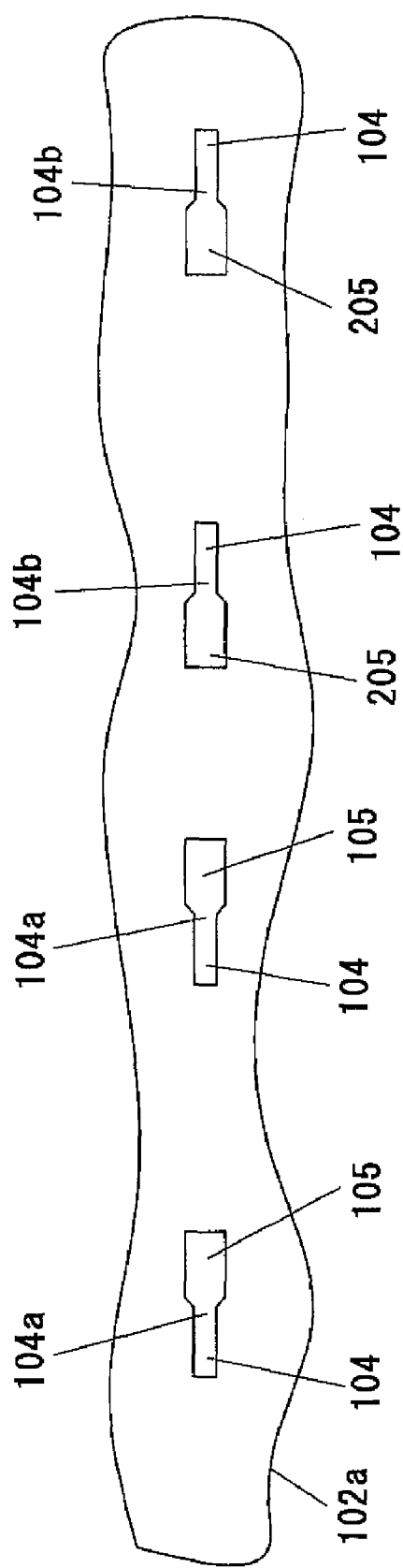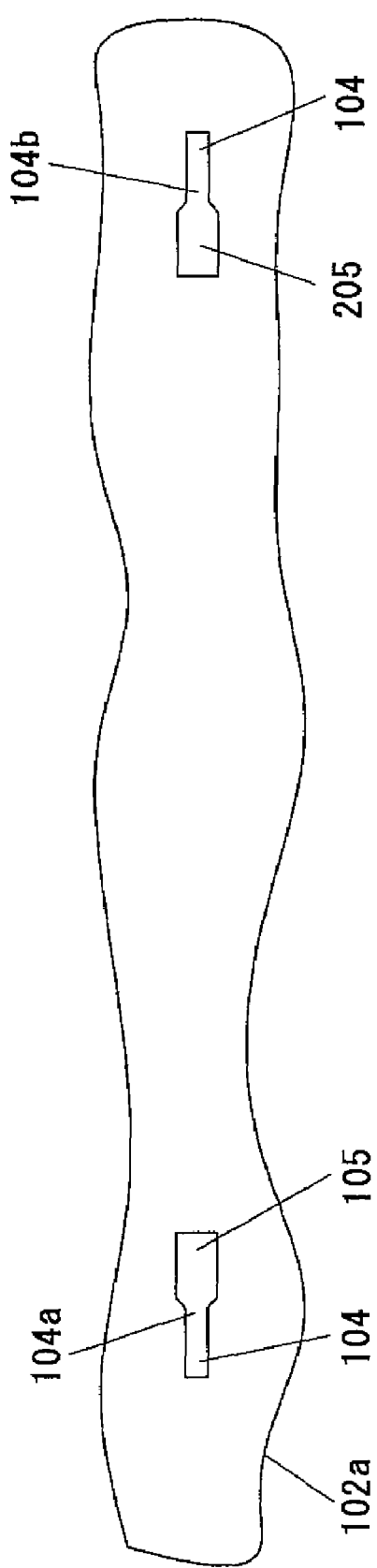
Fig. 14A
Fig. 14B

ELECTROMAGNETIC SHIELDING GASKET AND ELECTRONIC DEVICE PROVIDED THEREWITH

CROSS REFERENCE OF RELATED APPLICATIONS

The disclosure of Japanese Patent Applications No. 2007-012193 (filed Jan. 23, 2007), No. 2007-170201 (filed Jun. 28, 2007) and No. 2007-241938 (filed Sep. 19, 2007) including the specification, claims, drawings and abstract is incorporated herein by reference in its entirety.

BACKGROUND OF THE INVENTION

1. Technical Field

This invention relates to an electromagnetic shielding gasket for electromagnetically shielding gaps in electronic devices and also relates to an electronic device provided with the electromagnetic shielding gaskets.

2. Background Art

Conventionally, electromagnetic shielding gaskets for electromagnetically shielding gaps in electronic devices have been proposed. For example, a gasket is known that includes: a fitting part for fitting into a gasket holding hole bored from outer surface to inner surface of the first opposing wall constituting part of the casing of an electronic device, a gasket main part contacting the outer surface, and a come-off stopping part contacting the inner surface. The come-off stopping part has a leg part and a foot part that is connected to the leg part and disposed to form an acute angle relative to the leg part. The fitting part may be fitted in the gasket holding hole in the following manner; when the come-off stopping part is forced from the outer surface side of the first opposing wall into the gasket holding hole, the foot part of the come-off stopping part deforms elastically to reduce its width, passes through the gasket holding hole, and comes out on the inner surface side of the first opposing wall. When the foot part comes out on the inner surface side, the elastically deformed foot part restores original shape, and its tip comes into contact with the inner surface. In this way, the electromagnetic shielding gasket may be held in the gasket holding hole. In this state, even if a force works to draw the foot part from the inner surface side toward the outer surface side, because the foot part is disposed to form an acute angle relative to the leg part, the foot part is less likely to deform elastically, so that the foot part is less likely to be drawn through the gasket holding hole from the inner surface side toward the outer surface (Refer to Patent Document 1).

However, as the come-off stopping part of the above gasket is made up of the leg part and the foot part that is disposed to form an acute angle relative to the leg part, the distance from the base to the tip of the foot part is great, so that the overall height of the come-off stopping part is great. As a result, the foot part, in the state of being placed on the inner wall surface side, ends up in projecting by a great dimension from the inner wall surface toward the inside of the casing. Therefore, in the case for example other objects such as components housed in the casing are present near the inner wall surface of the casing of an electronic device, the foot part, in the process of being passed through the gasket holding hole, ends up in contacting the other objects and is hard to be placed on the inner wall surface side. So there may be cases in which the work of causing the electromagnetic shielding gasket to be held in the gasket holding hole is difficult. Therefore, the electromagnetic shielding gasket with the above-described come-off stopping part passed from the outer wall surface side into the gasket holding hole is hard to adapt to the electronic devices in which other objects are housed near the inner wall surface of the casing.

Patent Document 1
JP-A-2004-200444

DISCLOSURE OF THE INVENTION

The object of the invention is to solve the problems associated with such conventional electromagnetic shielding gasket as described above and to provide an electromagnetic shielding gasket projecting by a less amount from the inner surface toward the inside of the first opposing wall having the gasket holding hole and being less likely to come off through the gasket holding hole from the inner surface side to the outer surface side of the first opposing wall, and to provide an electronic device having such an electromagnetic shielding gasket.

The invention is directed to an electromagnetic shielding gasket for contacting first and second opposing walls, disposed across a gap, of an electronic device body, to electromagnetically shield the gap, the electromagnetic shielding gasket including: a fitting part having a width approximately the same or smaller than the width of a gasket holding hole formed in the first opposing wall from its outer wall surface to its inner wall surface, the fitting part being fitted in the gasket holding hole in sliding motion from the longitudinal end side of the gasket holding hole; a gasket body connected to the fitting part, the gasket body being brought into contact with the outer surface of the first opposing wall and with the second opposing wall; and a come-off stopping part connected to the fitting part and disposed on the inner wall surface side of the first opposing wall, the come-off stopping part including: a first lug projecting in the width direction of the fitting part from the first end face in the width direction of the fitting part; and a second lug projecting in the width direction of the fitting part from the second end face in the width direction of the fitting part, the first and second lugs constituting to keep at least one of the first distance from the second end face to the projecting tip of the first lug and the second distance from the first end face to the projecting tip of the second lug greater than the width of the gasket holding hole even when the first or second lug is deformed under external forces.

The invention is directed to an electronic device including the electromagnetic shielding gasket as defined above according to the invention and an electronic device body: wherein the come-off stopping part of the electromagnetic shielding gasket has a width, from the first projection tip to the second projection tip, smaller than the width of the gasket body; the first opposing wall of the electronic device body further includes a gasket guiding hole connecting to the gasket holding hole to introduce the fitting part of the electromagnetic shielding gasket into the gasket holding hole; and the gasket guiding hole has a width smaller than the width of the gasket body of the electromagnetic shielding gasket and approximately equal to or greater than the width of the come-off stopping part.

While the features of the invention are broadly shown above, the constitution and contents thereof, together with the object and features, will become more apparent from the following disclosure in reference to the accompanying drawings.

BRIEF DESCRIPTION OF DRAWINGS

FIG. 2A is a partial front view, showing the electromagnetic shielding gasket 1 according to the embodiment; and FIG. 2B, a side view thereof.

FIG. 3 is a partial rear view, showing the electromagnetic shielding gasket 1 according to the embodiment.

FIG. 12A is a partial front view, showing a front wall 102a of a communication device 200 and FIG. 12B is a sectional view, along the line XIIB-XIIB in FIG. 12A.

FIGS. 13A and 13B illustrate the sequence of fitting the electromagnetic shielding gasket 1 in the front wall 102a of the communication device 200.

FIG. 14A is a partial front view, showing a front wall 102a as another example in the embodiment. FIG. 14B is a partial front view, showing a front wall 102a as still another example in the embodiment.

FIGS. 16A and 16B shows the constitution of a communication device 300 and the sequence of fitting an electromagnetic shielding gasket 1 in a front wall 102a.

BEST FORM OF CARRYING OUT THE INVENTION

Figure 1:
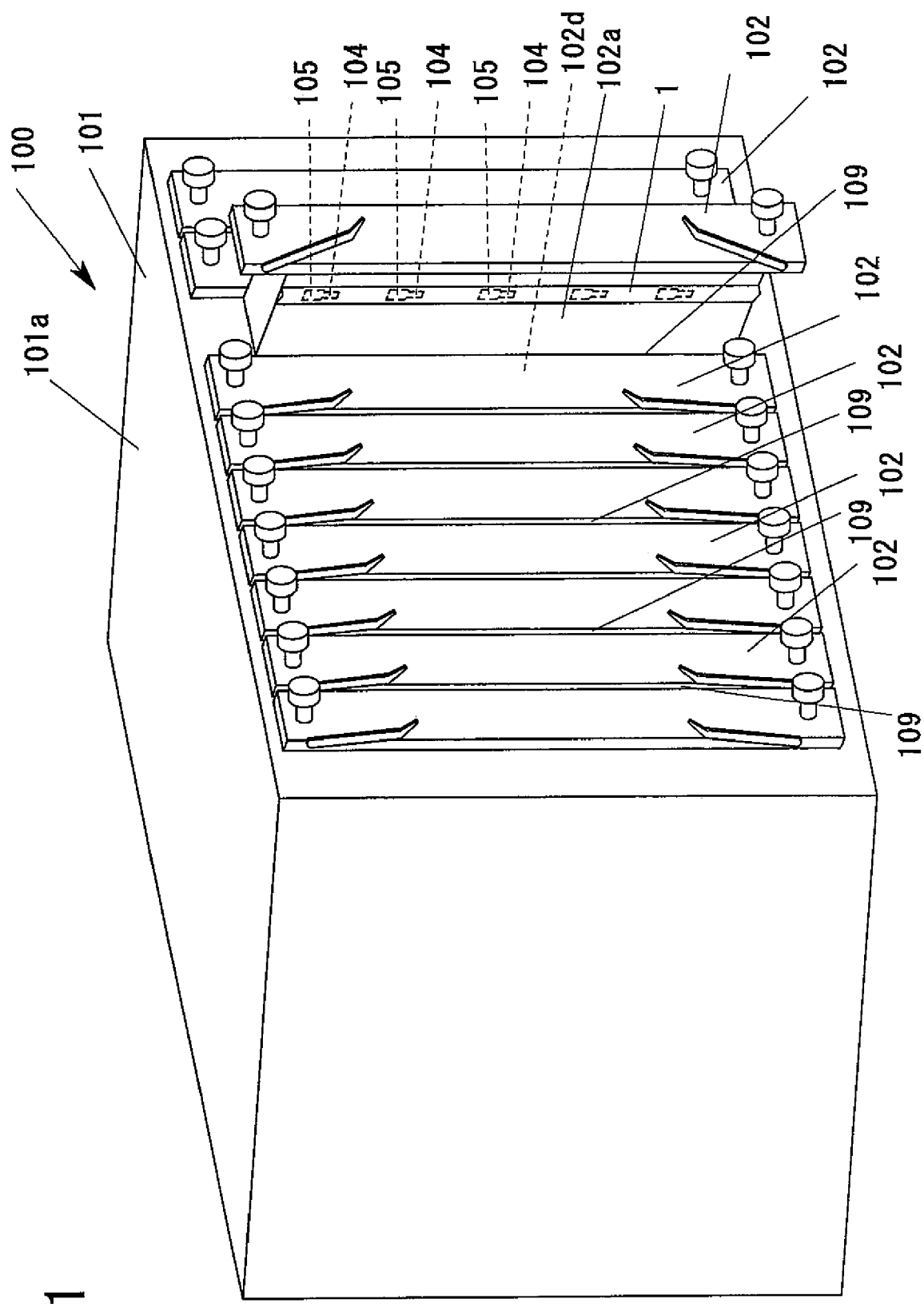
FIG. 1 is a perspective view, showing a communication device 100, as an embodiment, including an electromagnetic shielding gasket 1.
Figure 4:
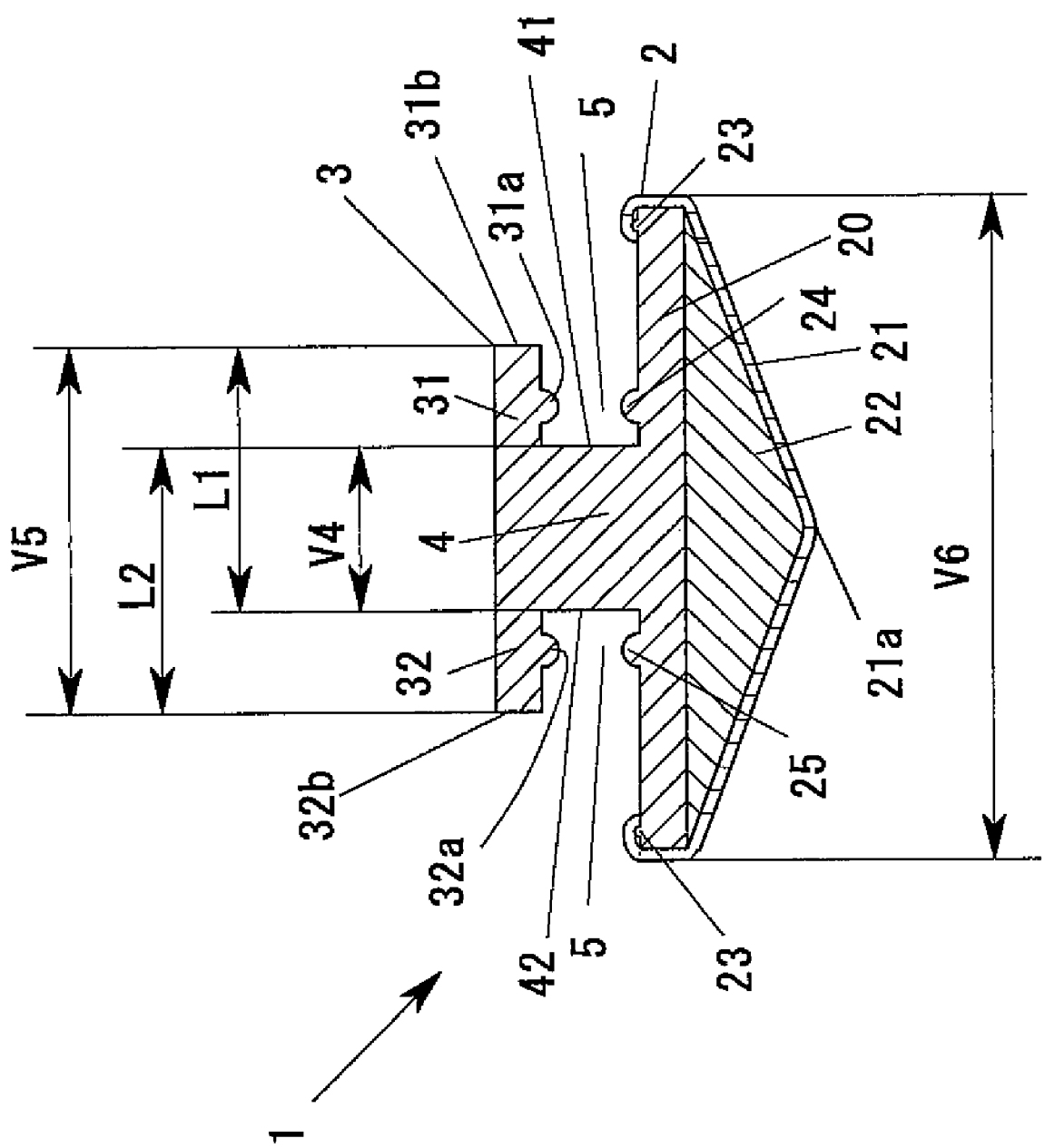
FIG. 4 is an enlarged sectional view, along the line IV-IV in FIG. 2A.

FIG. 1 is a perspective view showing a communication device which includes an electromagnetic shielding gasket of the present invention; FIG. 2A is a partial front view showing the electromagnetic shielding gasket according to an embodiment; FIG. 2B is its side view; FIG. 3 is its partial rear view; and FIG. 4 is an enlarged sectional view along the line IV-IV in FIG. 2A.

The electronic device using the electromagnetic shielding gasket of this embodiment is embodied as a communication device 100. The communication device 100 as shown in FIG. 1 includes a device body 101 as an electronic device body and the electromagnetic shielding gasket 1.

The device body 101 includes a casing 101a and a plural number of sub-casings 102 that can be put in and taken out of the casing 101a. The casing 101a and the sub-casings 102 are made of electrically conductive material such as metal. In this embodiment, the casing 101a and the sub-casings 102 are made of aluminum.

Figure 10:
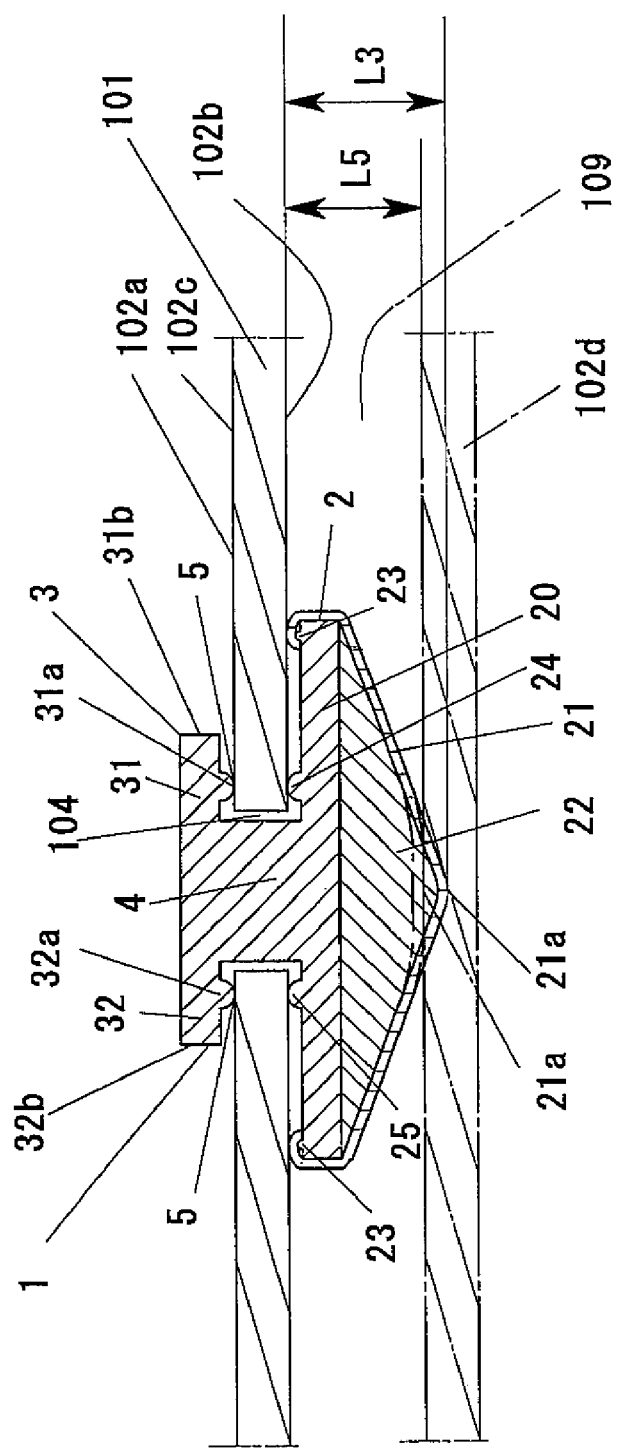
FIG. 10 is a sectional view, along the line X-X in FIG. 8.

In this embodiment, any two sub-casings 102 adjacent to each other are disposed across a specified gap 109 (as shown in FIG. 10) between the first opposing wall or the front wall 102a of one (rear side) sub-casing 102 and the second opposing wall or the rear wall 102d of the other (front side) sub-casing 102 opposing the front wall 102a.

Each sub-casing 102 houses objects to be housed such as printed wiring boards (not shown). Each sub-casing 102 is provided with a plural number of gasket holding holes 104 in its front wall 102a to hold the electromagnetic shielding gasket 1.

Figure 5:
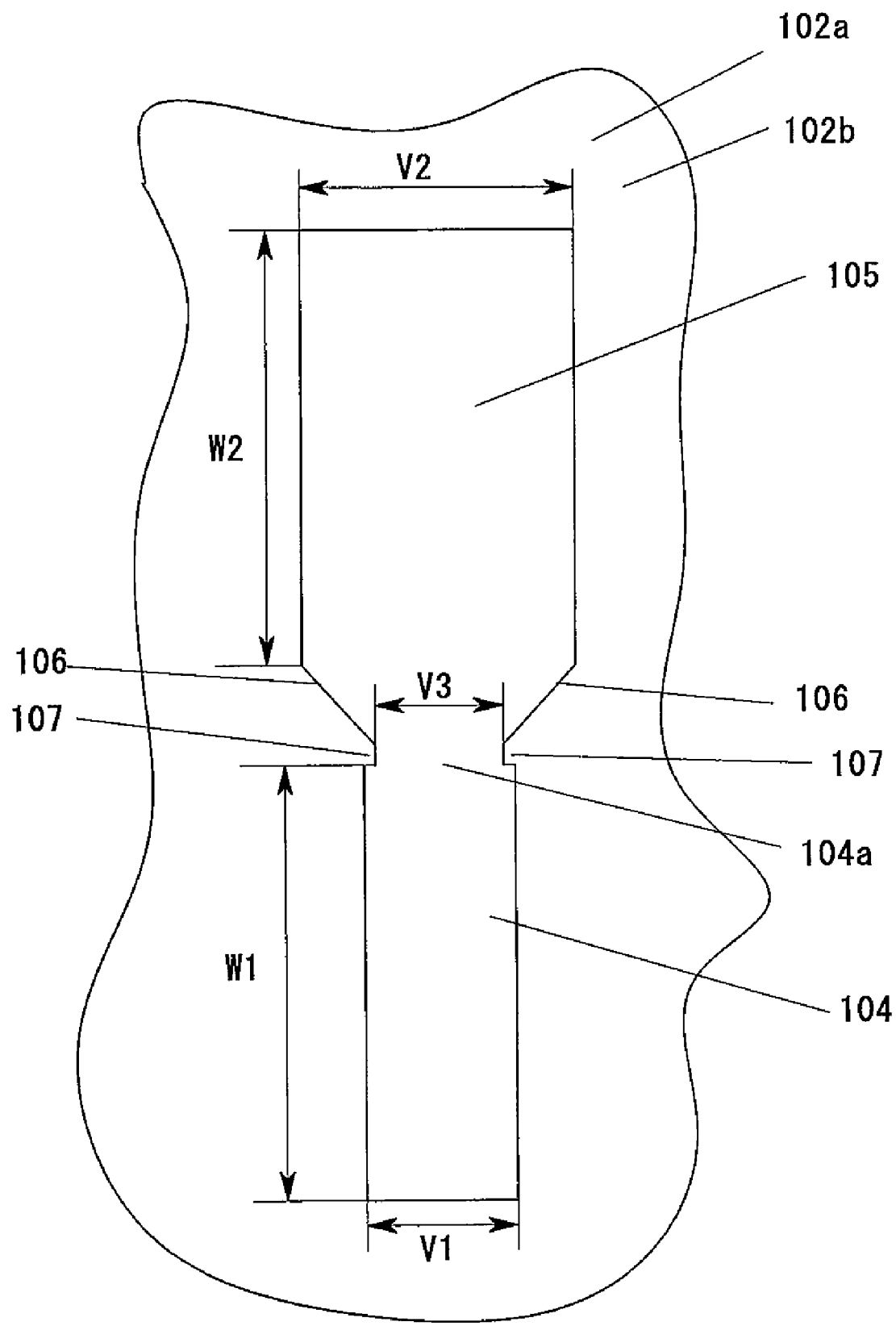
FIG. 5 illustrates a gasket holding hole 104, a gasket guiding hole 105, a guiding part 106, and a reverse checking part 107.
Figure 7:
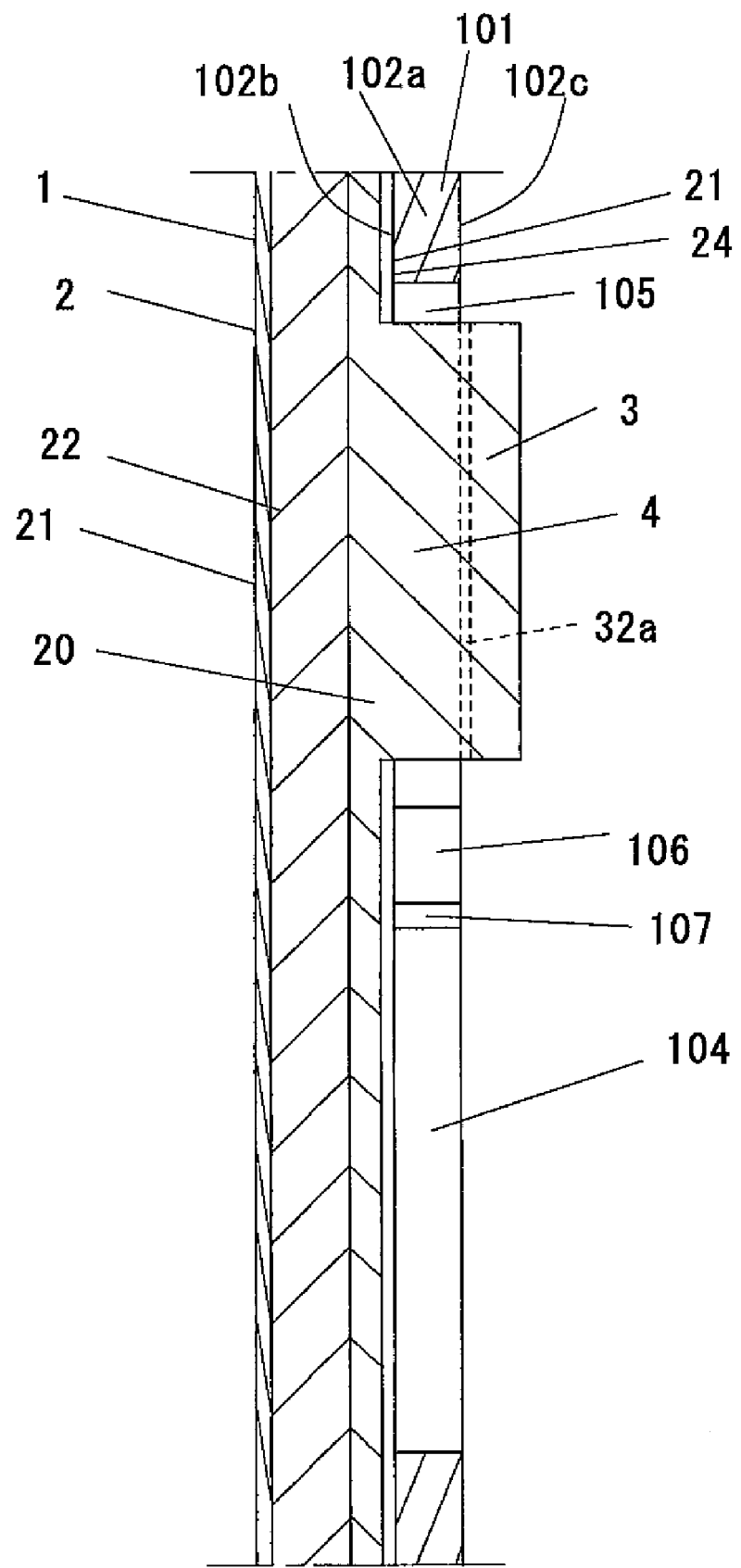
FIG. 7 is a sectional view, along the line VII-VII in FIG. 6.

The gasket holding holes 104 in this embodiment are disposed at nearly constant intervals along the front wall 102a in a vertical row. Each gasket holding hole 104 is formed to pass through from the outer surface 102b to the inner surface 102c (as shown in FIG. 7) of the front wall 102a. As shown in FIG. 5, the gasket holding hole 104 is made in a rectangular shape with its length W1 greater than its width V1.

The front wall 102a is also provided with rectangular gasket guiding holes 105 passing from the outer surface 102b to the inner surface 102c. The guiding hole 105 is for guiding a fitting part 4, to be described later, of the electromagnetic shielding gasket 1 into the gasket holding hole 104. Each gasket guiding hole 105 is connected to the longitudinal first end 104a (top end of the gasket holding hole 104 in the drawing) of the corresponding gasket holding hole 104.

The length W2 of the gasket guiding hole 105 is set to be about the same as the length W1 of the gasket holding hole 104. The width V2 of the gasket guiding hole 105 is set to be greater than the width V1 of the gasket holding hole 104.

Guiding parts 106, 106 and reverse checking parts 107, 107 are provided between the gasket holding hole 104 and the gasket guiding hole 105 bored in the front wall 102a.

The guiding parts 106, 106 are for guiding the fitting part 4 of the electromagnetic shielding gasket 1 from the gasket guiding hole 105 into the gasket holding hole 104. The guiding parts 106, 106 in this embodiment are made as slopes with their mutual distance decreasing from the gasket guiding hole 105 toward the gasket holding hole 104.

The reverse checking parts 107, 107 are for preventing the fitting part 4 of the electromagnetic shielding gasket 1 fitted in the gasket holding hole 104 from reversing. The reverse checking parts 107, 107 in this embodiment are formed as opposing two projections projecting inward from both width-direction ends of the gasket holding hole 104. Therefore, the distance V3 between the reverse checking parts 107, 107 is smaller than the width V1 of the gasket holding hole 104.

Next, the electromagnetic shielding gasket 1 is described.

The electromagnetic shielding gasket 1 includes, as shown in FIGS. 2A, 2B, 3 and 4, the gasket body 2, the come-off stopping parts 3, and the fitting parts 4.

The gasket body 2 is made as a single, elongated member. The gasket body 2 as shown in FIG. 4 includes a sheet-like connecting member 21, a supporting member 20 supporting the connecting member 21, and an elastic member 22 for providing the connecting member 21 with elasticity.

The connecting member 21 is to come into contact with opposing side walls 102a, 102d of adjacent two sub-casings 102, 102 of the device body 101 to make electrically conductive connection between them. The connecting member 21 in this embodiment is made of a conductive plastic material containing carbon.

The supporting member 20 is made in an elongated plate shape. The rear surface of the supporting member 20 is provided with two connecting member securing parts 23, 23 stopping the connecting part 21, and two contacting parts, a first contacting part 24 and a second contacting part 25, disposed between the connecting member securing parts 23, 23.

The connecting member securing parts 23, 23 are disposed on both width-direction ends of the supporting member 20. The connecting member 21 is secured to the connecting member securing parts 23, 23.

Specifically, the connecting member 21 is placed to cover the entire front face of the supporting member 20 and its width-direction ends are turned around to the rear face side of the supporting member 20 and secured to the connecting member securing parts 23, 23 by securing process such as welding.

The overall width V6 of the gasket body 2 after the connecting member 21 is secured to both the connecting member securing parts 23, 23 as described above is set to be greater than the width V2 (shown in FIG. 5) of the gasket guiding hole 105.

The first contacting part 24 is formed as a projection projecting from the rear face of the supporting member 20 toward the rear in nearly semicircular cross section and is provided along the full length of the supporting member 20. The projecting length of the first contacting part 24 from the rear face of the supporting member 20 is set to be the same as or slightly smaller than the projecting length from the rear face of the supporting member 20 of part of the connecting member 21 secured to the connecting member securing parts 23, 23.

The second contacting part 25 is almost the same in constitution as the first contacting part 24. The second contacting part 25 is disposed at a specified distance from and almost parallel to the first contacting part 24. The distance between the first and second contacting parts 24 and 25 is set to be greater than the width V1 of the gasket holding hole 104.

The elastic member 22 is disposed between the supporting member 20 and the connecting member 21 on the front side of the supporting member 20. With the elastic member 22 disposed in this way, the connecting member 21 is formed in a quasi triangular cross section having an apex 21a. Incidentally, the elastic member 22 may be made of, for example, foam material such as sponge, rubber, cotton, etc. It is also possible not to use purposely the elastic member 22 but utilize the elasticity of the connecting member 21 itself.

As shown in FIG. 10, the distance L3 from the apex 21a to the projection tip of part of the connecting member 21 secured to the connecting member securing parts 23, 23 is set to be greater than the dimension L5 of the gap 109 in the device body 101.

As shown in FIG. 2, a plural number of the fitting parts 4 are provided along the length of the gasket body 2 in positions corresponding to the gasket holding holes 104 of the device body 101. As shown in FIG. 4, the fitting part 4 is formed as connected to the middle between the first and second contacting parts 24 and 25 on the rear face of the supporting member 20 to project rearward of the supporting member 20.

The width V4 and the length W4 of the fitting part 4 are respectively set to be smaller than the width V1 and the length W1 of the gasket holding hole 104, and to be smaller than the width V2 and the length W2 of the gasket guiding hole 105. Therefore, the fitting part 4 can slide through the gasket guiding hole 105 into the gasket holding hole 104.

The width V4 of the fitting part 4 is set to be slightly greater than the distance V3 between the reverse checking parts 107, 107. As a result, the fitting part 4 fitted in the gasket holding hole 104 is hard to reverse to the gasket guiding hole 105. In this embodiment, the width V4 of the fitting part 4 is set to be greater by about 0.05 mm than the distance V3 between the reverse checking parts 107, 107. In this way, the fitting part 4 fitted in the gasket holding hole 104 is made hard to reverse to the gasket guiding hole 105 even when the fitting part 4 receives vibration or the like. On the other hand, it is adapted that the fitting part 4 may be reversed by hand to the gasket guiding hole 105.

The come-off stopping part 3 is to prevent the fitting part 4 fitted in the gasket holding hole 104 from coming off the inner wall surface side toward the outer wall surface. As shown in FIG. 2B, the come-off stopping part 3 is connected to the rear end of the fitting part 4. In this way, the come-off stopping part 3 is disposed across a specified distance to the supporting member 20 of the gasket body 2.

The vertical dimension (length) of the come-off stopping part 3 is set to be approximately the same as the vertical dimension W4 of the fitting part 4. In this embodiment, the come-off stopping part 3, the supporting part 20 of the gasket body 2, and the fitting part 4 are formed as a single member of plastic material such as ABS (acrylonitrile butadiene styrene) resin. In this embodiment, parts between the come-off stopping parts 3, 3, . . . and between the fitting parts 4, 4, . . . are cut off after extrusion process, to form or leave a plural number of the come-off stopping parts 3, 3, . . . and the fitting parts 4, 4 . . . .

As shown in FIG. 4, the come-off stopping part 3 has a first lug 31 projecting in the width direction from a first width-direction end face 41 of the fitting part 4 and a second lug 32 projecting in the width direction from a second width-direction end face 42 of the fitting part 4.

The first lug 31 includes a third contacting part 31a contacting the inner wall surface 102c of the front wall 102a of the sub-casing 102. The third contacting part 31a is formed at a position opposite the first contacting part 24 of the supporting member 20 in nearly semicircular cross section projecting toward the first contacting part 24.

A wall receiving part 5 for receiving the front wall 102a is formed between the third contacting part 31a and the first contacting part 24. The distance between the third contacting part 31a and the first contacting part 24, forming the wall receiving part 5, is set to be nearly the same as the thickness of the front wall 102a.

The first distance L1 between the projection tip 31b of the first lug 31 and the second end face 42 of the fitting part 4 is set to be greater than the width V1 of the gasket holding hole 104.

As will be described later, the first lug 31 is constituted to maintain the first distance L1 greater than the width V1 of the gasket holding hole 104 even when the first lug 31 deforms under external forces.

The second lug 32 is almost the same in constitution as the first lug 31. As shown in FIG. 4, specifically, the second lug 32 has a fourth contacting part 32a for contacting the inner surface 102c of the front wall 102a of the sub-casing 102. The fourth contacting part 32a is formed at a position opposite the second contacting part 25 of the supporting member 20 in nearly semicircular cross section projecting toward the second contacting part 25.

Another wall receiving part 5 for receiving the front wall 102a is formed between the fourth contacting part 32a and the second contacting part 25. The distance between the fourth contacting part 32a and the second contacting part 25, forming the wall receiving part 5, is set to be nearly the same as the thickness of the front wall 102a.

The second distance L2 between the projection tip 32b of the second lug 32 and the first end surface 41 of the fitting part 4 is set to be greater than the width V1 of the gasket holding hole 104 (see FIG. 5). Also the second lug 32, like the first lug 31, is constituted to maintain the second distance L2 greater than the width V1 of the gasket holding hole 104 even when the second lug 32 deforms under external forces.

The overall width V5 of the come-off stopping part 3, or the distance from the projection tip 31b of the first lug 31 to the projection tip 32b of the second lug 32, is set to be smaller than the width V6 of the entire width of the gasket body 2. The width V5 of the come-off stopping part 3 is greater than the width V1 of the gasket holding hole 104, and is smaller than the width V2 of the gasket guiding hole 105.

The electromagnetic shielding gasket 1 constituted as described above is held in the gasket holding hole 104 of the front wall 102a of the sub-casing 102 as described below.

Figure 6:
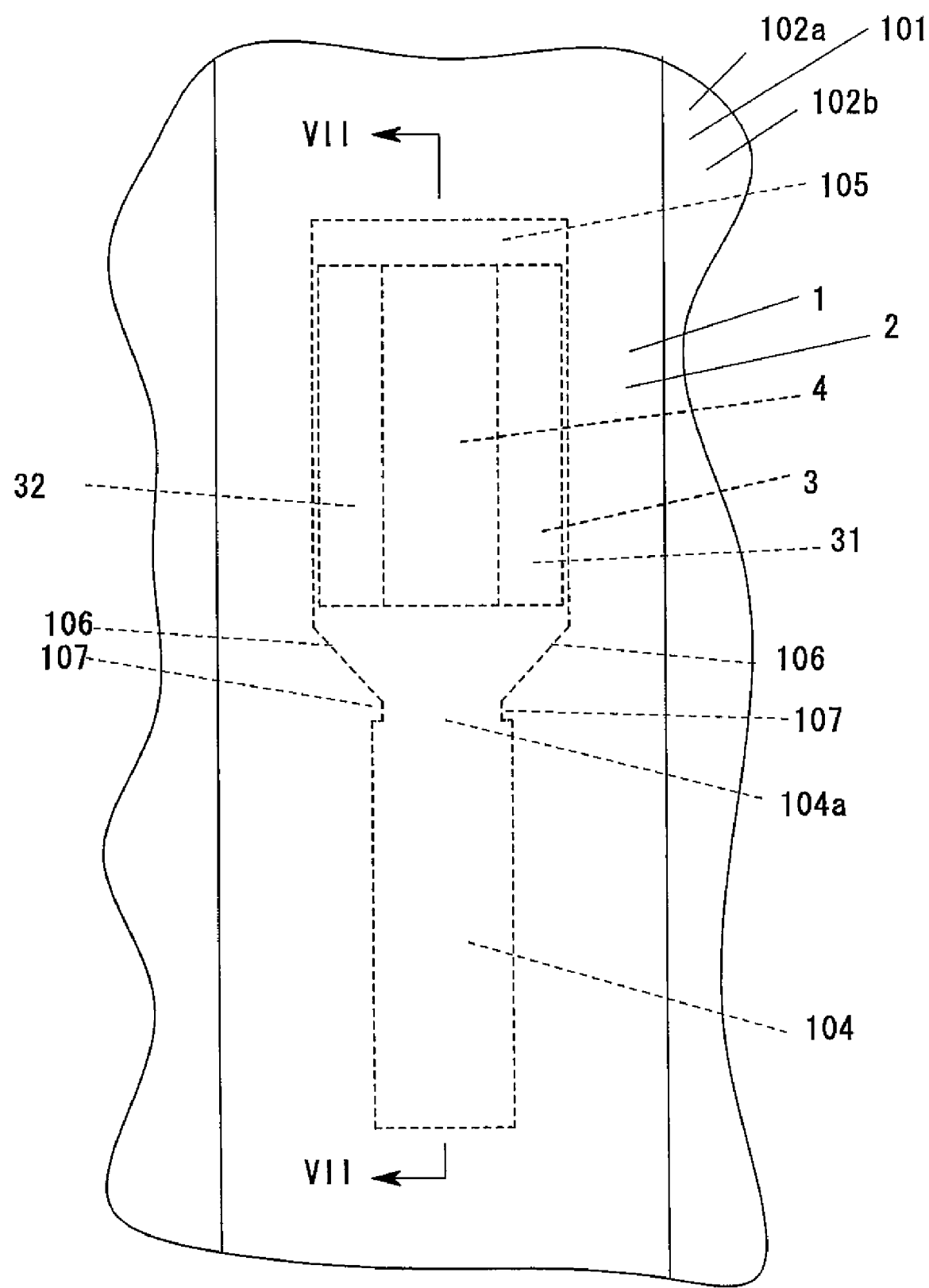
FIG. 6 illustrates a state in which the fitting part 4 and the come-off stopping part 3 of the electromagnetic shielding gasket 1 are fitted in the gasket guiding hole 105.

First, as shown in FIGS. 6 and 7, the come-off stopping parts 3, 3, . . . of the electromagnetic shielding gasket 1 are fitted, by a motion from the outer surface 102b side toward the inner surface 102c of the front wall 102a, in the gasket guiding holes 105, . . . of the front wall 102a until the gasket body 2 of the electromagnetic shielding gasket 1 comes into contact with the outer surface 102b of the front wall 102a.

In this state, the third contacting part 31a's projection tip and the fourth contacting part 32a's projection tip of the come-off stopping part 3 of the electromagnetic shielding gasket 1 are located nearly on the same plane as the inner surface 102c of the front wall 102a, while the wall receiving parts 5 are nearly in the same position as the front wall 102a.

Next, from the above state, the electromagnetic shielding gasket 1 is moved in the direction from the gasket guiding hole 105 toward the gasket holding hole 104 of the wall surface 102a.

The above action makes the front wall 102a received in the wall receiving part 5 of the electromagnetic shielding gasket 1, while making the fitting part 4 of the electromagnetic is shielding gasket 1 slid and fitted in the gasket holding hole 104 through the first end 104a side.

Also at this time, as the fitting part 4 is guided along the guiding parts 106, 106, from the gasket guiding hole 105 into the gasket holding hole 104, the fitting part 4 is smoothly fitted from the gasket guiding hole 105 into the gasket holding hole 104.

Moreover, as the first contacting part 24, the second contacting part 25, the third contacting part 31a, and the fourth contacting part 32a constituting the wall receiving parts 5 are made in the shape of projection, their contact areas with the front wall 102a are small. Therefore, when making the front wall 102a received in the wall receiving parts 5, 5 by sliding motion, the above-mentioned parts cause little sliding friction with the front wall 102a, so that the front wall 102a is received smoothly into the wall receiving parts 5, 5.

Once the fitting part 4 fits in the gasket holding hole 104, the reverse checking parts 107, 107 in normal use prevent the fitting part 4 from reversing from the gasket holding hole 104 toward the gasket guiding hole 105. In this way, it is possible to keep the fitting part 4 fitted in the gasket holding hole 104.

In the state of the fitting part 4 fitted in the gasket holding hole 104, the gasket guiding hole 105 is in the state of being covered with the gasket body 2.

As shown in FIG. 1 for example, when the sub-casing 102 is placed in the casing 101a after making the electromagnetic shielding gasket 1 held in the gasket holding hole 104 of the sub-casing 102, the apex 21a of the connecting member 21 is pressed as shown in FIG. 10 into contact with the rear wall 102d (indicated with dash-and-dotted line) of the adjacent sub-casing 102 located on the front side.

When the apex 21a is pressed against the rear wall 102d, due to the elasticity of the elastic member 22, the apex 21a is kept pressed against the rear wall 102d. Therefore, it is possible in this state to securely make electrically conductive between the adjacent sub-casings 102 through the connecting member 21 of the electromagnetic shielding gasket 1, and to electromagnetically shield the gap 109.

Figure 11:
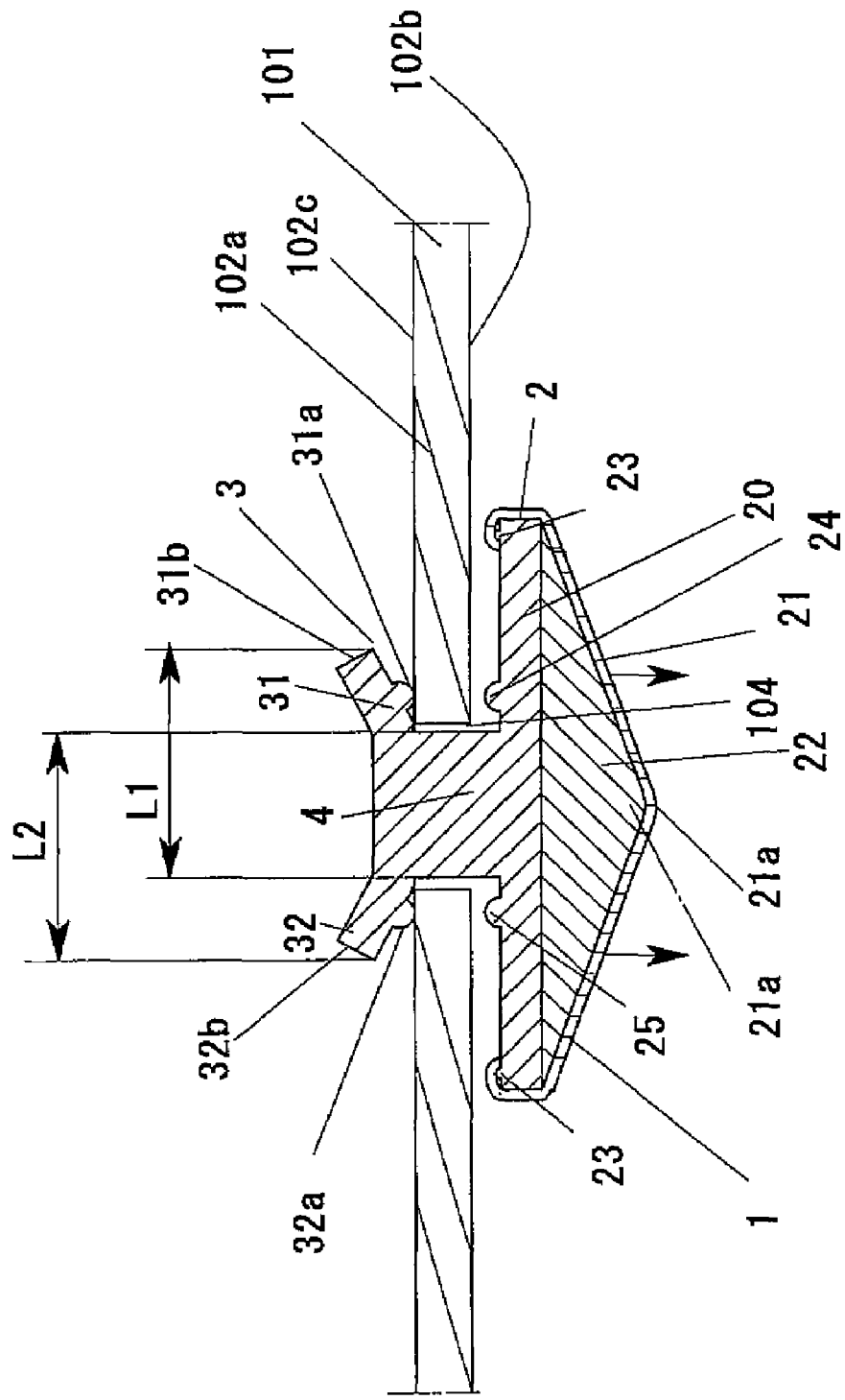
FIG. 11 is a view, illustrating a deformed come-off stopping part 3.

As shown in FIG. 11, for example, even when a force is applied in the direction of drawing the fitting part 4 through the gasket holding hole 104 off the inner surface 102c side toward the outer surface 102b of the front wall 102a, and either one or both of the first lug 31 and the second lug 32 is or are deformed with reaction force from the inner wall surface 102c of the front wall 102a, both the first distance L1 and the second distance L2 remain greater than the width V1 of the gasket holding hole 104.

Therefore, it is possible to make the fitting part 4 without the possibility of coming off through the gasket holding hole 104 in the direction from the inner surface 102c side toward the outer surface 102b of the front wall 102a.

Next will be described a communication device 200 provided with an electromagnetic shielding gasket according to another embodiment of the invention.

The communication device 200 is different from the above communication device 100 in the following points. That is, in the communication device 100 as shown in FIG. 1, the direction of connecting the gasket guiding hole 105 to the gasket holding hole 104 provided in the front wall 102a is the same for all the gasket guiding holes 105 and the gasket holding hole 104 (in FIG. 1, all the gasket guiding holes 105 are connected to the upper ends of the gasket holding holes 104). In other words, as shown in FIG. 5, all the gasket guiding holes 105 are connected to the longitudinal first end 104a of the corresponding gasket holding holes 104.

In the communication device 200 according to this embodiment, however, part of the plural number of gasket guiding holes 105 are connected to the longitudinal first end 104a of the gasket holding holes 104 while the rest of the gasket guiding holes 105 are connected to the second end 104b, opposite the first end 104a, of the gasket holding holes 104. The electromagnetic shielding gasket 1 is made of plastic material with elastic flexibility. The communication device 200 is the same in constitution in other points as the communication device 100.

An example of the communication device 200 is shown in FIGS. 12A and 12B. FIG. 12A is a partial plan view showing the front wall 102a of the communication device 200. FIG. 12B shows the section, along line XIIB-XIIB in FIG. 12A.

In this example, for the sake of convenience of explanation, part of the front wall 102a of the communication device 200 is assumed to have four gasket holding holes 104 and four gasket guiding holes connected to the former. The four gasket holding holes 104 are disposed at equal intervals in lateral direction of the drawing.

Of the four gasket guiding holes, three gasket guiding holes 105 on the left side in the drawings are respectively connected to the first ends 104a of corresponding gasket holding holes 104. On the other hand, the rightmost gasket guiding hole 205 in the drawings is connected to the second end 104b of the corresponding gasket holding hole 104.

FIG. 13A and FIG. 13B are views for explaining the sequence of fitting the electromagnetic shielding gasket 1 in the front wall 102a of the communication device 200. To fit the electromagnetic shielding gasket 1 in the front wall 102a, first, the come-off stopping parts 3 and fitting parts 4, three for each, of the electromagnetic shielding gasket 1 are fitted in the corresponding three gasket guiding holes 105 in the direction from the observer's side toward the reverse side of the paper sheet of FIG. 12A. This state is the same as that shown in FIGS. 6 and 7 for the embodiment described before.

Figure 8:
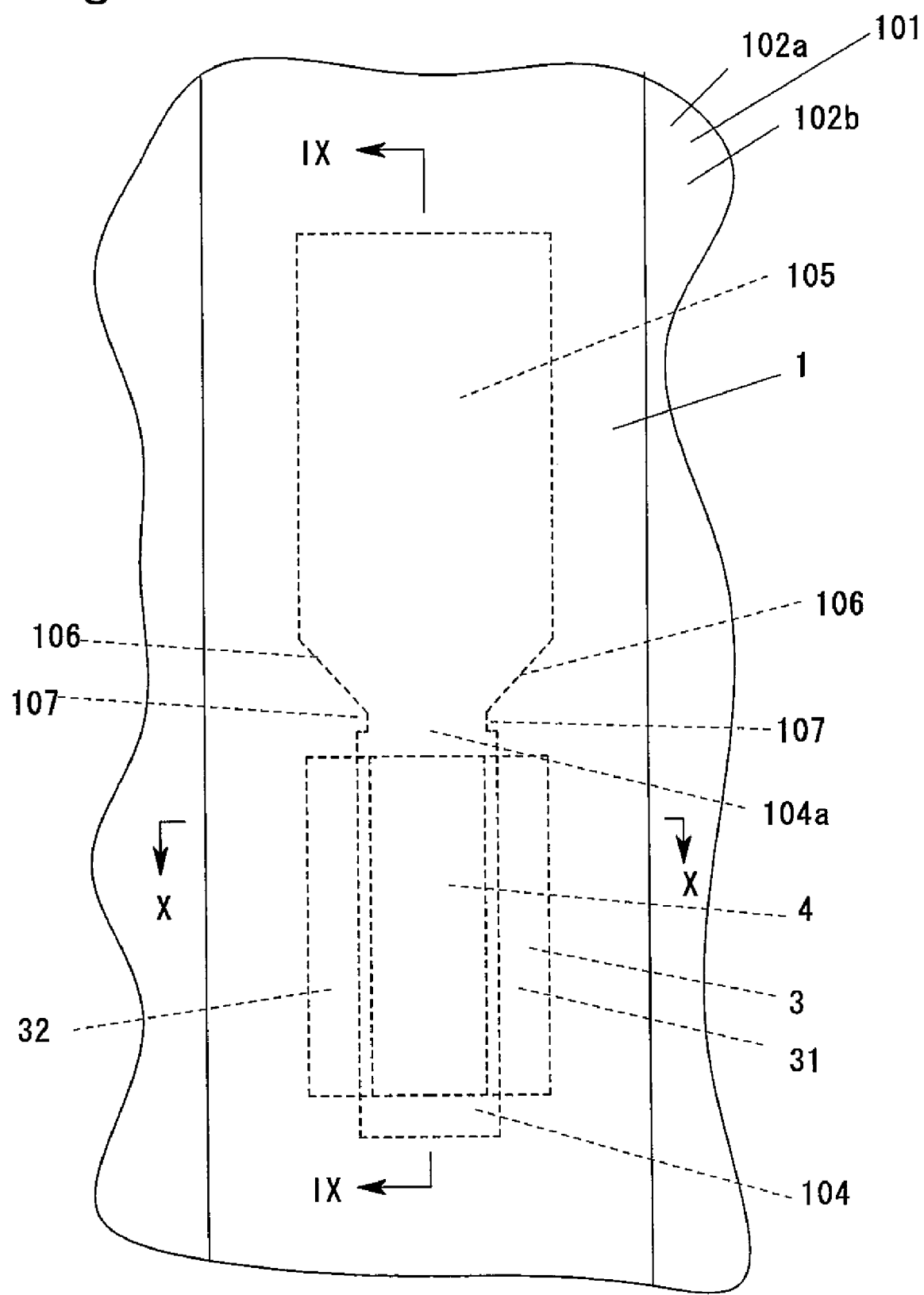
FIG. 8 illustrates a state in which the fitting part 4 of the electromagnetic shielding gasket 1 fits in the gasket holding hole 104.
Figure 9:
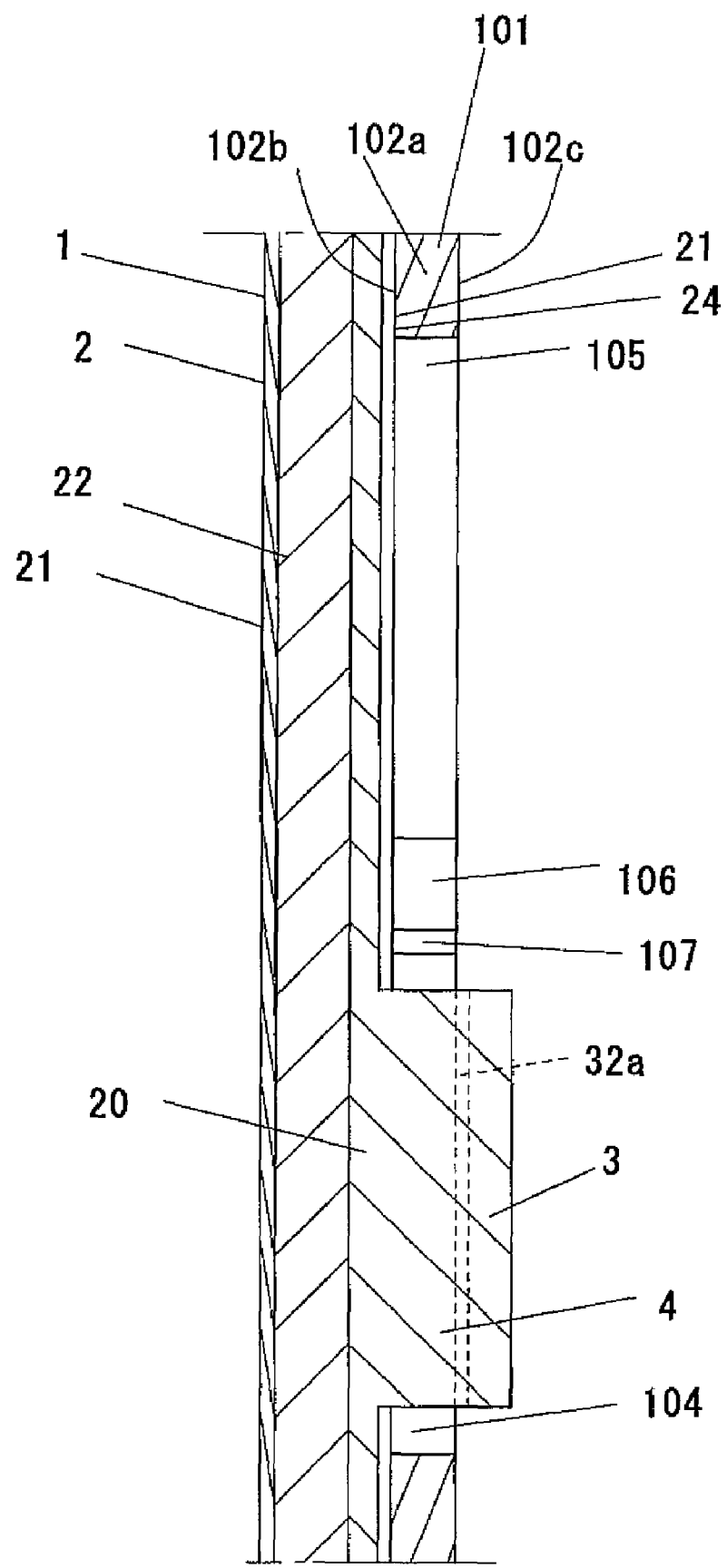
FIG. 9 is a sectional view, along the line IX-IX in FIG. 8.

Next, from this state, the electromagnetic shielding gasket 1 is slid leftward in FIG. 12A (downward in FIGS. 6 and 7). The state after sliding the gasket is the same as that shown in FIGS. 8 and 9 for the previous embodiment. As a result, the three fitting parts 4 are simultaneously fitted in the corresponding gasket holding holes 104.

Next, from this state, while bending the right hand end part of the gasket body 2 of the electromagnetic shielding gasket 1, the come-off stopping part 3 and the fitting part 4 in the rightmost position are fitted in the gasket guiding hole 205 in the rightmost position shown in FIG. 12A in the direction from the observer's side toward the reverse side of the paper sheet of FIG. 12A. This state is shown in FIG. 13A.

Next, when the bent electromagnetic shielding gasket 1 is released from this state, the gasket restores its original state as shown in FIG. 13B. In this way, the rightmost fitting part 4 of the electromagnetic shielding gasket 1 fits into the rightmost gasket holding hole 104. Thus, the electromagnetic shielding gasket 1 is installed in the front wall 102a of the communication device 200.

The fitting parts 4 fitted in as described above does not come off the gasket holding holes 104 unless the electromagnetic shielding gasket 1 is bent. Therefore, the electromagnetic shielding gasket 1 is securely connected to the front wall 102a of the communication device 200. On the other hand, the electromagnetic shielding gasket 1 may be easily removed from the front wall 102a in a sequence opposite that for fitting.

In this embodiment, the reverse checking part 107 (shown in FIG. 5) in the previous embodiment is not provided on the front wall 102a. While the reverse checking part 107 may be provided, it is preferable not to provide it because the electromagnetic shielding gasket 1 is securely fitted in the front wall 102a without providing it, and moreover, damages are avoided when removing the electromagnetic shielding gasket 1 from the front wall 102a. Without providing the reverse checking part 107 required of high precision makes it possible to manufacture the front wall 102a at a lower cost.

Next, FIG. 14A shows a partial plan view of the front wall 102a as another example of this embodiment. This embodiment is different from the example shown in FIG. 12A: the two 105, on the left, of the four gasket guiding holes are connected to the first ends 104a of respectively corresponding gasket holding holes 104. On the other hand, the two gasket guiding holes 205 on the right in the drawing are connected to the second ends 104b of respectively corresponding gasket holding holes 104.

Next, FIG. 14B shows a partial plan view of the front wall 102a as still another example in this embodiment. In this example, of the two gasket guiding holes, the one 105 on the left in the drawing is connected to the first end 104a of the corresponding gasket holding hole 104. On the other hand, the gasket guiding hole 205 on the right in the drawing is connected to the second end 104b of the corresponding gasket holding hole 104.

As described above, in the case the electromagnetic shielding gasket 1 having elastic flexibility is used, as shown in FIGS. 12A through 14B, of the plural sets (four sets in FIGS. 12A through 14A; two sets in FIG. 14B) of "the corresponding gasket holding holes 104 and gasket guiding holes," the gasket guiding holes 105 and 205 of the adjacent particular two sets of "the corresponding gasket holding holes 104 and gasket guiding holes" may be disposed adjacent to each other.

Figure 15A:
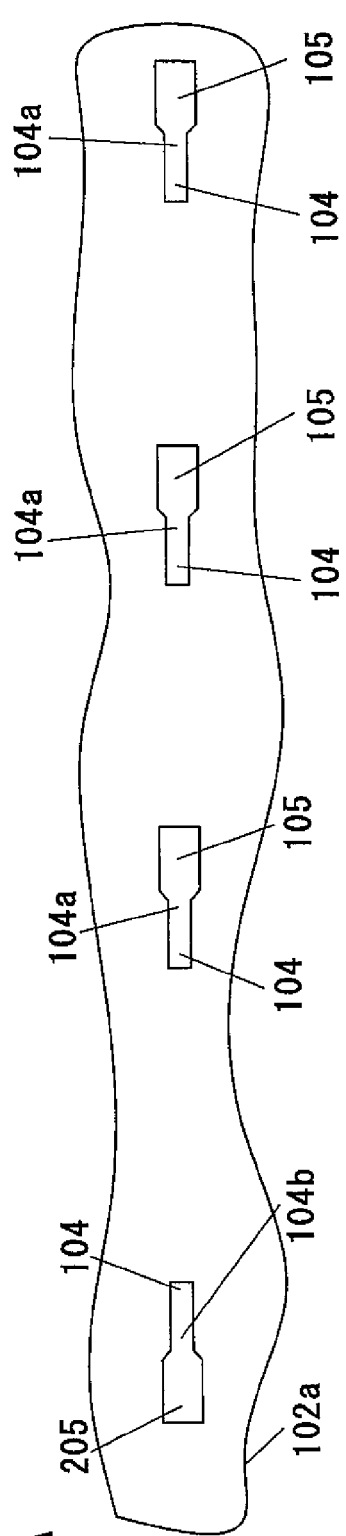
FIGS. 15A to 15C are partial front views, showing a front wall 102a as still yet another example in the embodiment.
Figure 15B:
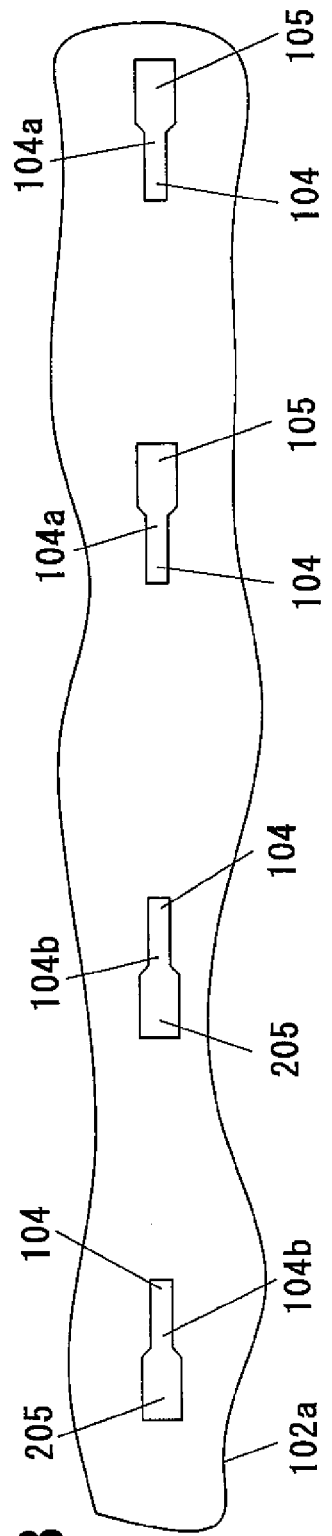
Figure 15C:
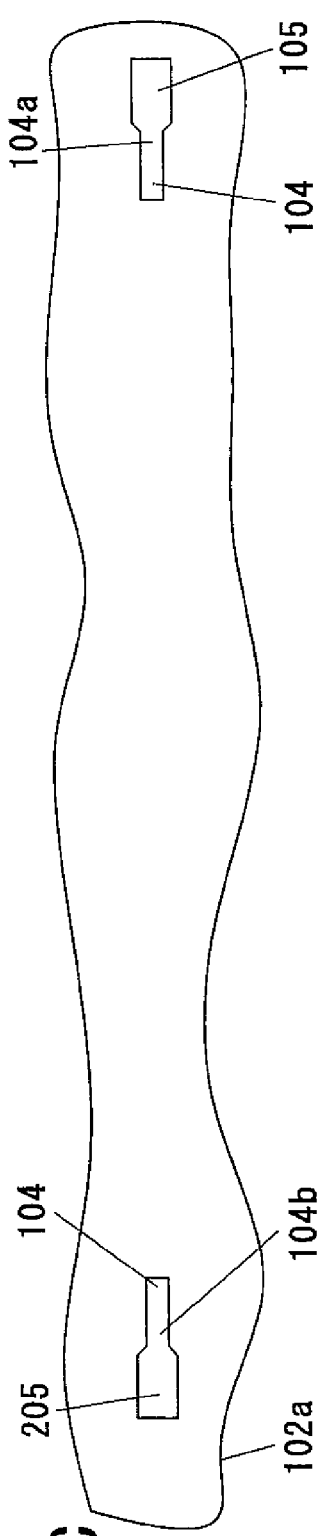

Next, FIGS. 15A through 15C respectively show partial plan views of the front walls 102a as further examples in this embodiment. These front walls 102a are used when the electromagnetic shielding gasket 1 has elastic extendibility.

In this case, as shown in FIGS. 15A through 15C, of the plural sets (four sets in FIGS. 15A and 15B; two sets in 15C) of "the corresponding gasket holding holes 104 and gasket guiding holes," the gasket holding holes 104 of the adjacent two particular sets of "the corresponding gasket holding holes 104 and gasket guiding holes" may be disposed adjacent to each other.

In the examples shown in FIGS. 15A through 15C for the sequence of fitting the electromagnetic shielding gasket 1 into the front wall 102a, the example sequence shown in FIGS. 12A through 14B, in which the electromagnetic shielding gasket 1 is bent and released to recover the original state, may be replaced with a sequence in which the electromagnetic shielding gasket 1 is elastically extended and released to recover the original state.

In the above embodiments, it is assumed that the electromagnetic shielding gasket 1 includes one gasket body 2, a plural number of fitting parts 4, and a plural number of come-off stopping parts 3. In the device body 101, the gasket holding holes 4 are included in positions corresponding to the fitting parts 4 and the come-off stopping parts 3. However, the assumption is not limited to the above embodiments but may be appropriately modified.

For example, the electromagnetic shielding gasket 1 may be constituted with a single gasket body 2, a plural number of fitting parts 4, and a plural number of come-off stopping parts 3, while the gasket holding hole 104 of the device body 101 may be constituted with a single hole about the same in length as the gasket body 2. Alternatively, the electromagnetic shielding gasket 1 may be constituted with a single gasket body 2, a single fitting part 4 about the same in length as the gasket body 2, and a single come-off stopping part 3 about the same in length as the fitting part 4, while the gasket holding hole 104 may be a single hole about the same in length as the gasket body 2.

Moreover, in the case a plural number of the fitting parts 4 and the come-off stopping parts 3 are used with the electromagnetic shielding gasket 1, the number of the fitting parts 4 and the come-off stopping parts 3 may be changed appropriately.

Further, while the first embodiment above is assumed that the guiding parts 106, 106 and the reverse checking parts 107, 107 are disposed between the gasket holding hole 104 and the gasket guiding hole 105, the assumption may be appropriately modified.

For example, it may be assumed that either the guiding parts 106, 106 or the reverse checking parts 107, 107 are disposed, or none of them are disposed, between the gasket holding holes 104 and the gasket guiding holes 105.

While the second embodiment above is assumed that the guiding parts 106, 106 are disposed between the gasket holding hole 104 and the gasket guiding hole 105, 205, the assumption may be appropriately modified.

For example, it may be assumed that both the guiding parts 106, 106 and the reverse checking parts 107, 107 are disposed, or neither of them are disposed, between the gasket holding holes 104 and the gasket guiding holes 105, 205.

Alternatively, it may be assumed that the provision of the guiding parts 106, 106 and/or the reverse checking parts 107, 107 is different between the gasket guiding holes 105 and 205.

For example, a constitution is possible in which all the gasket guiding holes 105, 205 are provided with the guiding parts 106, 106 and only the gasket guiding holes 205 are provided with the reverse checking parts 107, 107.

Further, in the above embodiments, it is possible that the provision of the guiding parts 106, 106 and/or reverse checking parts 107, 107 is different between the gasket holding holes 104 located in the middle and those located at the ends.

For example, a constitution is possible in which the guiding parts 106, 106 are provided in all the gasket holding holes 104, while the reverse checking parts 107, 197 are provided in the gasket holding holes 104 that are located at one end (or both ends).

Further, while the above embodiments are assumed to be provided with the gasket guiding holes 105(205), they may not be provided. For example, a constitution is possible in which the first end of the gasket holding hole 104 is provided with an opening through which the electromagnetic shielding gasket 1 is slid into the gasket holding hole 104 and the opening of the gasket holding hole 104 is closed with the first end of the electromagnetic shielding gasket 1.

Moreover, while the fitting part 4 and the come-off stopping part 3 are about the same in the vertical or longitudinal dimension, they may be made different from each other in appropriate manner.

While the above embodiments are adapted that the width V2 of the gasket guiding hole 105 (205) is set greater than the width V5 of the come-off stopping part 3 of the electromagnetic shielding gasket 1 in normal state or externally unloaded state, the width V2 of the gasket guiding hole 105(205) may be set to any value as long as the come-off stopping part 3 can fit in from the surface 102b side into the gasket guiding hole 105(205).

For example, even if the width V2 of the gasket guiding hole 105(205) is the same as or smaller than the width V5 of the come-off stopping part 3 of the electromagnetic shielding gasket 1 in normal state, the width V2 is permissible on the following conditions: when the come-off stopping part 3 is pressed into the gasket guiding hole 105(205) in the direction from the outer surface 102b side, the first lug 31 and/or the second lug 32 receive reaction force from the outer wall 102 and bend, so that the width V2 of the gasket guiding hole 105(205) becomes greater than the width V5 of the bent come-off stopping part 3, and the come-off stopping part 3 can fit in the gasket guiding hole 105(205) in the direction from the outer surface 102b side.

Alternatively, the dimensional relationship between the widths V2 and V5 may be set so that the come-off stopping part 3 is fitted in the gasket guiding hole 105(205) while tilting the come-off stopping part 3.

In the above embodiments, it is assumed that the gasket holding hole 4 is disposed in the front wall 102a serving as the first opposing wall of the sub-casing 102 of an electronic device or the communication device 100(200). The electromagnetic shielding gasket 1 is held in the gasket holding hole 104 of the front wall 102a of the sub-casing 102 so as to electromagnetically shield the gap 109. However, the assumption is not limited to the above but may be appropriately modified.

For example, it is possible to assume as follows: the top or bottom wall of the sub-casing 102 of the communication device 100(200) is assumed to be the first opposing wall, and provide the top or bottom wall with a gasket holding hole 104 to hold the electromagnetic shielding gasket 1. The casing 101a of the communication device 100 (200) opposing the top or bottom wall is assumed to be the second opposing wall. And the gap between the casing 101a and the top or bottom wall is electromagnetically shielded with the electromagnetic shielding gasket 1.

Further, the electronic device related to this invention is not limited to the communication device 100(200). Rather, the invention is applicable to various devices that emit electromagnetic waves.

Next, a communication device 300 having an electromagnetic shielding gasket as still another embodiment of the invention is described.

The communication device 300 is different from the above-described communication device 200 in the following points. That is, in the communication device 200, as shown in FIGS. 12A and 13A, a plural number of (three on the left hand in the drawing) gasket holding holes 104 are provided and connected at longitudinal first ends 104a to the gasket guiding holes 105. The interval from one first end 104a of the gasket holding hole 104 to another is the same for all the gasket holding holes 104, and the interval is the same as that from one fitting direction end (left end in the drawing) of the corresponding fitting part 4 to another of the electromagnetic shielding gasket 1.

Figure 16A:
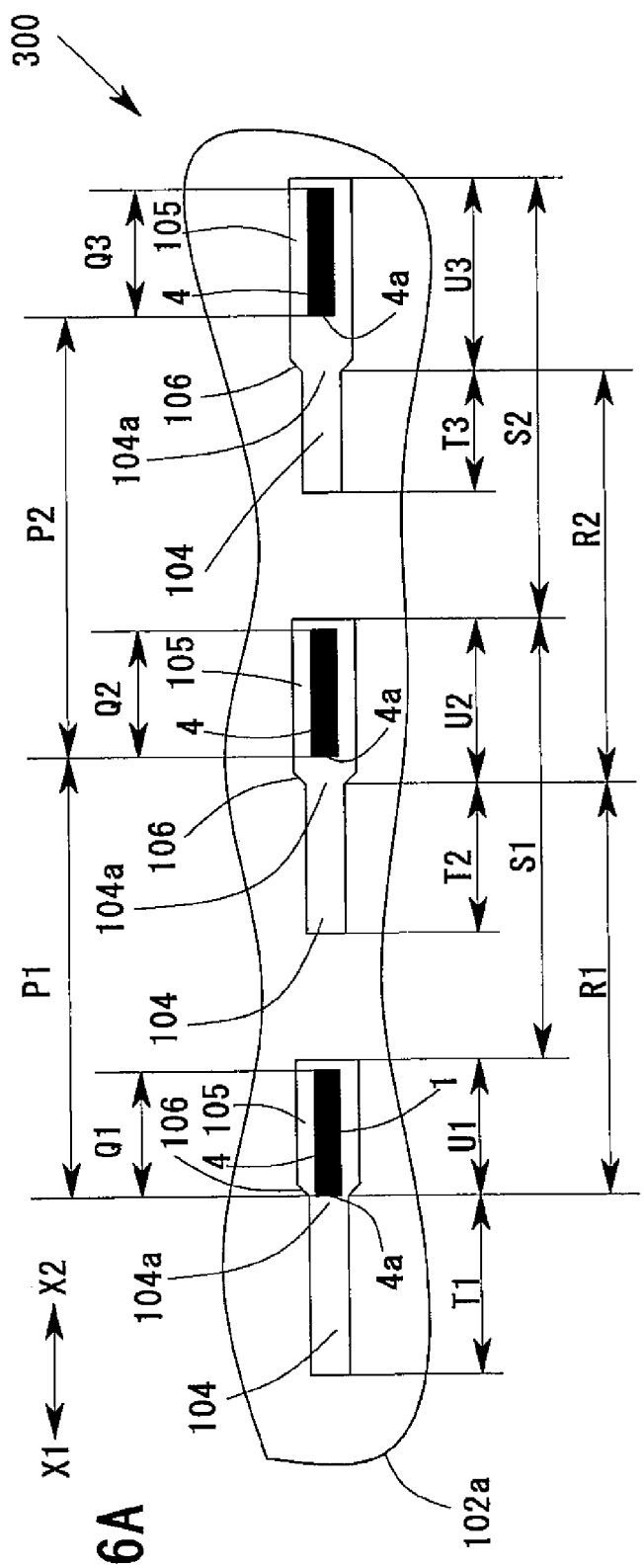

On the other hand, in the communication device 300 according to this embodiment, also a plural number of (three in the drawing) gasket holding holes 104 are provided and connected at longitudinal first ends 104a to the gasket guiding holes 105. However, in this embodiment as shown in FIG. 16A, at least one of intervals R1 and R2 from one first end 104a to another of the gasket holding hole 104 is made different from the intervals P1 and P2 from one fitting direction end (called the reference position 4a; left hand in the drawing) to another of the corresponding fitting part 4 of the electromagnetic shielding gasket 1.

Specifically in this example, it is assumed that R1=R2<P1=P2. Also in this example, longitudinal dimensions Q1, Q2, Q3 (corresponding to W4 in FIG. 2) of the fitting part 4 of the electromagnetic shielding gasket 1 are assumed to be Q1=Q2=Q3.

The longitudinal dimensions T1, T2, T3 (corresponding to the longitudinal dimension W1 in FIG. 5) of the gasket holding hole 104 are assumed to be T1>T2>T3. In this example, the reverse checking part 107 shown in FIG. 5 is not provided on the front wall 102a. Also in this example, it is assumed that T2=Q2.

The sums U1, U2, U3 of the longitudinal dimensions of the gasket guiding hole 105 (corresponding to the longitudinal dimension W2 in FIG. 5) and the fitting direction dimension (X1 direction dimension in FIG. 16A) of the guiding part 106 are assumed to be U1<U2<U3. It is also assumed that Q1<U1.

The sums (T1+U1); (T2+U2); (T3+U3) of the longitudinal dimension T1; T2; T3 of the gasket holding hole 104 and the above dimension U1; U2; U3 are assumed to be (T1+U1)= (T2+U2)=(T3+U3). The interval S6; S2 from one longitudinal end on the side not connected to the gasket holding hole 104 (X2 direction end in the drawing) of the gasket guiding hole 105 to another is assumed to be S1=P1; S2=P2 (in this example, further to be S1=S2).

Otherwise the communication device 300 is assumed to be the same in constitution as the communication device 200.

Figure 16B:
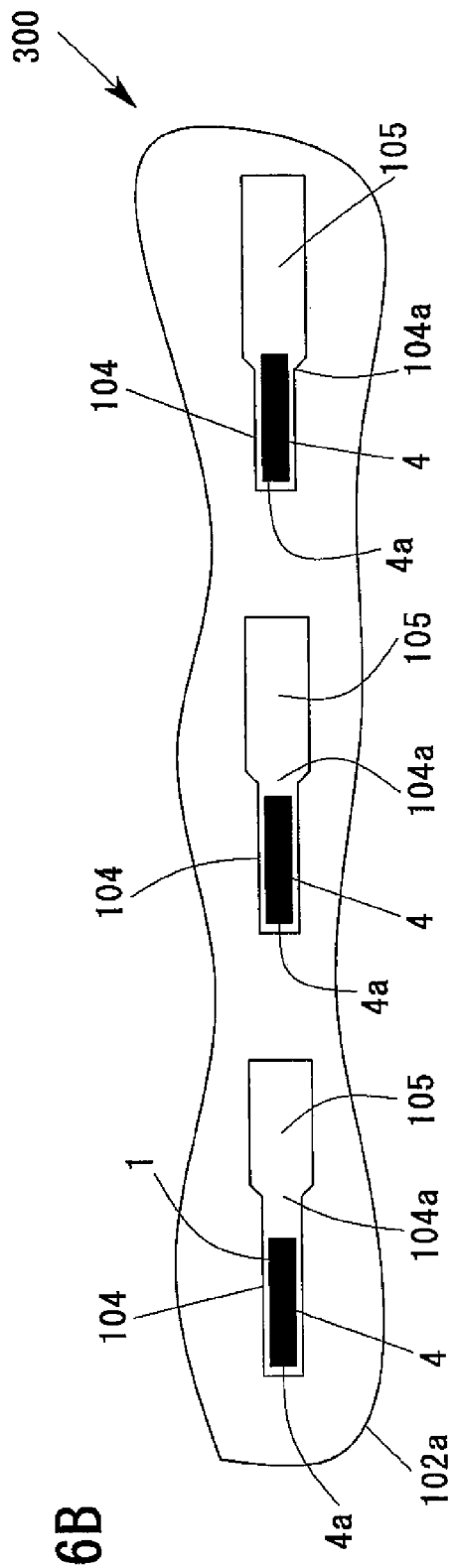

Next, in reference to FIGS. 16A and 16B, the sequence of fitting the electromagnetic shielding gasket 1 in the front wall 102a of the communication device 300 is described. The sequence of fitting the electromagnetic shielding gasket 1 in the front wall 102a is almost the same as that for the communication device 200.

That is, three come-off stopping parts 3 (not shown) and the fitting parts 4 of the electromagnetic shielding gasket 1 are fitted in three corresponding gasket guiding holes 105 shown in FIG. 16A in the direction from the observer's side toward the reverse side of the drawing, and the electromagnetic shielding gasket 1 is slid in the X1 direction (leftward) in FIG. 16A to bring about the state of FIG. 16B.

As described above, in the communication device 300, the interval R1; R2 (R1=R2) from one first end 104a of the gasket holding hole 104 to another is assumed to be smaller than the interval P1; P2 (P1=P2) from one reference position 4a of the corresponding fitting part 4 to another of the electromagnetic shielding gasket 1.

Therefore, when the electromagnetic shielding gasket 1 in the state shown in FIG. 16A is slid in the X1 direction, the three reference positions 4a pass the first end 104a of the corresponding gasket holding holes 104 at different times in sequence: first the reference position 4a of the leftmost fitting part 4, next the reference position 4a of the middle fitting part 4, and last the reference position 4a of the rightmost fitting part 4.

Therefore, it is possible to scatter the time points at which frictional resistance on the guiding part 6 occurs when the reference position 4a of the fitting part 4 of the electromagnetic shielding gasket 1 is guided from the gasket guiding hole 105 of greater width (V2 in FIG. 5) into the gasket holding hole 104 of smaller width (V1 in FIG. 5).

Therefore, the electromagnetic shielding gasket 1 may be fitted in the front wall 102a of the communication device 300 without applying a great sliding force.

After that, in similar sequence to that for the communication device 200 (FIGS. 13A and 13B), the right end (not shown) of the gasket body 2 of the electromagnetic shielding gasket 1 is bent while the fitting part 4 at the right end (not shown) is fitted in the gasket guiding hole 205 (not shown) and the bend is released, so that the fitting part 4 at the right end (not shown) remains fitted in the gasket holding hole 104 (not shown).

Incidentally, the dimensions indicated in FIG. 16A are not restrictive. For example, while it is assumed in this example that R1=R2<P1=P2, it may be that R1<P1=P2=R2. Moreover, all the variations in the above communication device 200, unless incompatible, are applicable to the communication device 300.

While this embodiment (communication device 300) is shown as an example of application based on the communication device 200, the embodiment is not restrictive. This embodiment (communication device 300) may also be shown as an example of application based on the communication device 100. In the latter case, all the variations in the communication device 100, unless incompatible, are applicable to the communication device 300.

The electromagnetic shielding gasket according to the first invention is constituted such that the gasket includes the fitting part to be slid from the longitudinal end side of the gasket holding hole and fitted in the gasket holding hole; the come-off stopping part includes the first lug projecting from the first end surface, in the width direction, of the fitting part in the width direction of the fitting part and the second lug projecting from the second end surface, in the width direction, of the fitting part in the width direction of the fitting part; the first lug and the second lug are constituted to maintain at least one of the first distance from the second end surface to the first lug's projection tip and the second distance from the first end surface to the second lug's projection tip greater than the width of the gasket holding hole even when the first or second lug deforms under external forces.

This makes it possible to prevent the come-off stopping part from passing through the gasket holding hole from the inner surface side toward the outer surface side, and keep the electromagnetic shielding gasket held in the gasket holding hole.

It is also possible, unlike the conventional one fitted from the outer surface side into the gasket holding hole, to make the come-off stopping part unnecessary to include a leg part and a foot part disposed at an acute angle to the leg part, so that the come-off stopping part may be generally low profile. Owing to this, the amount of projection of the come-off stopping part in the direction from the inner surface of the first opposing wall toward inside can be reduced. Therefore, in the case for example any objects are present in the vicinity of the inner surface of the first opposing wall, it is possible to eliminate the possibility of such objects interfering with the come-off stopping part when the fitting part is inserted into the gasket holding hole, so that the work of holding it in the gasket holding hole is facilitated. Therefore, it is possible to make it suitable for electronic devices with other objects present in the vicinity of the inner surface of the first opposing wall.

As for the electromagnetic shielding gasket according to the second invention, the gasket body is made of a single, elongated member with a plural number of come-off stopping parts and fitting parts disposed at intervals along the longitudinal direction of the gasket body.

This makes it possible, when the fitting parts are slid and fitted in the gasket holding holes, to reduce resistance and facilitate the work of holding them in the gasket holding holes.

As for the electronic device having the electromagnetic shielding gasket according to the third invention, the come-off stopping part of the electromagnetic shielding gasket is constituted such that the lateral distance between the projection tip of the first lug and the projection tip of the second lug is smaller than the width of the gasket body; the first opposing wall of the electronic device body further includes the gasket guiding holes, connected to the gasket holding holes, for guiding the fitting parts of the electromagnetic shielding gasket into the gasket holding holes; and the gasket guiding hole have a width smaller than the width of the gasket body and to be nearly equal to or greater than the width of the come-off stopping part of the electromagnetic shielding gasket.

Thus, the come-off stopping part and the fitting part may fit from the outer surface side into the gasket guiding hole. In the state of being fitted, it is possible to place the come-off stopping part on the inner surface side of the first opposing wall. Therefore, from this state, it is possible for example to move or slide the fitting part of the electromagnetic shielding gasket toward the gasket holding hole, so that the electromagnetic shielding gasket is easily fitted in the gasket holding hole to be held in there.

Now, once the electromagnetic shielding gasket is held in the gasket holding hole, the gasket guiding hole is in the state of being covered with the gasket body, so that electromagnetic waves do not leak through the gasket guiding hole.

As for the electronic device having the electromagnetic shielding gasket according to the fourth invention, the gasket body of the electromagnetic shielding gasket is made of a single, elongated member. A plural number of come-off stopping parts and fitting parts are disposed at intervals along the longitudinal direction of the gasket body. The gasket holding holes of the electronic device body are provided in positions corresponding to the come-off stopping parts and the fitting parts of the electromagnetic shielding gasket. The gasket guiding holes are disposed corresponding to the gasket holding holes.

Thus, it is possible to fit the come-off stopping parts and the fitting parts respectively into the gasket guiding holes from the outer surface side. In the fit-instate, it is possible to place the come-off stopping parts on the inner surface side of the first opposing wall. Therefore, from that state it is possible to fit the fitting parts in the respective gasket holding holes by moving the electromagnetic shielding gasket toward the gasket holding holes. At that time, because it has only to move the gasket by the length of the fitting part, the work of inserting the fitting parts in the gasket holding holes is facilitated.

In the electronic device having the electromagnetic shielding gasket of the fifth invention, some of the plural number of gasket guiding holes are connected to the longitudinal first direction ends of the gasket holding holes and the rest of the gasket guiding holes are connected to the longitudinal second ends of the gasket holding holes.

Therefore, if the electromagnetic shielding gasket is made flexible or elastically extendable, the fitting parts of the electromagnetic shielding gasket may be respectively fitted in the corresponding gasket holding holes in the following manner.

That is, first the come-off stopping parts and the fitting parts are fitted in the corresponding gasket guiding holes connected to the first ends of the gasket holding holes. After that, the electromagnetic shielding gasket is moved toward the gasket holding holes, so that all the fitting parts are fitted at a time in the corresponding gasket holding holes. Next, the electromagnetic shielding gasket is bent (or extended), so that the come-off stopping parts and the fitting parts are fitted in the corresponding gasket guiding holes connected to the second ends of the gasket holding holes. Then, the electromagnetic shielding gasket is restored to normal state, so that the fitting parts are fitted in the corresponding gasket holding holes.

The fitting parts fitted in as described above cannot come off the gasket holding holes unless the electromagnetic shielding gasket is bent or extended, so that it is securely connected to the electronic device. Moreover, it is advantageous because the fitting parts cannot come off the gasket holding holes even if dimensional accuracy of the gasket holding holes is low.

In the electronic device having the electromagnetic shielding gasket according to the sixth invention, the gasket holding holes, connected to the gasket guiding holes at the longitudinal first ends of the gasket holding holes, are provided, and at least one interval from one first end of the gasket holding hole to another first end is made different from the interval between reference positions of the corresponding fitting parts of the electromagnetic shielding gasket.

Therefore, when the fitting parts of the electromagnetic shielding gasket are slid in one direction from the gasket guiding holes of the electronic device body toward the gasket holding holes, it is possible to make the fitting parts pass the first end surfaces of the gasket holding holes at different time points.

Therefore it is possible to time-wise scatter resistance forces occurring due to friction when the fitting parts of the electromagnetic shielding gasket pass the first end surfaces of the gasket holding holes. As a result, the electromagnetic shielding gasket may be fitted in the electronic device body without exerting a great force.

In the electronic device having the electromagnetic shielding gasket according to the seventh invention, the first opposing wall further includes, between the gasket holding hole and the gasket guiding hole, the guiding part for guiding the fitting part of the electromagnetic shielding gasket from the gasket guiding hole to the gasket holding hole.

Thus, it is possible to easily fit the fitting part of the electromagnetic shielding gasket from the gasket guiding hole through the guiding part into the gasket holding hole.

In the electronic device having the electromagnetic shielding gasket according to the eighth invention, the first opposing wall further includes, between the gasket holding hole and the gasket guiding hole, the guiding part for guiding the fitting part of the electromagnetic shielding gasket from the gasket guiding hole to the gasket holding hole, and the reverse checking part for preventing the fitting part of the electromagnetic shielding gasket held in the gasket holding hole from reversing to the gasket guiding hole.

Thus, it is possible to easily fit the fitting part of the electromagnetic shielding gasket from the gasket guiding hole through the guiding part into the gasket holding hole.

Once the fitting part of the electromagnetic shielding gasket is fitted in the gasket holding hole, the reverse checking part hinders the fitting part from reversing to the gasket guiding hole even if the fitting part is subjected to vibration or the like. Therefore, it is possible to hold the fitting part fitted in the gasket holding hole.

Description has been made of the preferred embodiments of the present invention. The terminology employed herein is for the purpose of illustration but not of limitation. It should be understood that many changes and modification can be made within the scope of the appended claims without departing from the scope and spirit of the present invention. Also, while only typical embodiments have been described in detail, it will be understood by those skilled in the art that various modifications may be made therein without departing from the novel teaching and advantages of the present invention. Thus, such modifications are all included in the scope of the present invention.

What is claimed is:

1. An electromagnetic shielding gasket for contacting first and second opposing walls, disposed across a gap, of an electronic device body, to electromagnetically shield the gap, the electromagnetic shielding gasket comprising: a fitting part having a width approximately the same or smaller than a width of a gasket holding hole formed in the first opposing wall to penetrate from an outer wall surface to an inner wall surface of the first opposing wall, the fitting part being fitted in the gasket holding hole in sliding motion from a longitudinal end side of the gasket holding hole; a gasket body connected to the fitting part, the gasket body being brought into contact with the outer surface of the first opposing wall and with the second opposing wall; and a come-off stopping part connected to the fitting part and disposed on the inner wall surface side of the first opposing wall, the come-off stopping part comprising: a first lug projecting in a width direction of the fitting part from a first end face in the width direction of the fitting part; and a second lug projecting in the width direction of the fitting part from a second end face in the width direction of the fitting part, the first and second lugs constituting to keep at least one of a first distance from the second end face to a projecting tip of the first lug and a second distance from the first end face to a projecting tip of the second lug greater than the width of the gasket holding hole even when the first or second lug is deformed under external forces.

2. The electromagnetic shielding gasket of claim 1, wherein the gasket body is made of a single, elongated member; and the come-off stopping parts and the fitting parts are disposed at intervals in a longitudinal direction of the gasket body.

3. An electronic device comprising the electromagnetic shielding gasket of claim 1 and an electronic device body, wherein the come-off stopping part of the electromagnetic shielding gasket has a width, from the first projection tip to the second projection tip, smaller than the width of the gasket body;

the first opposing wall of the electronic device body further includes a gasket guiding hole connecting to the gasket holding hole to introduce the fitting part of the electromagnetic shielding gasket into the gasket holding hole; and the gasket guiding hole has a width smaller than the width of the gasket body of the electromagnetic shielding gasket and approximately equal to or greater than the width of the come-off stopping part.

4. An electronic device of claim 3, wherein the gasket body of the electromagnetic shielding gasket is made of a single, elongated member;

a plurality of the come-ff stopping parts and the fitting part of the electromagnetic shielding gaskets are disposed at intervals in the longitudinal direction of the gasket body;

a plurality of the gasket holding holes of the electronic device body are disposed in positions corresponding to the come-off stopping parts and the fitting parts of the electromagnetic shielding gasket; and a plurality of the gasket guiding holes are disposed corresponding to the gasket holding holes, respectively.

5. The electronic device of claim 4, wherein some of the gasket guiding holes are connected to the longitudinal first ends of the gasket holding holes while the rest of the gasket guiding holes are connected to the second ends, opposite the longitudinal first ends, of the gasket holding holes.

6. The electronic device of claim 4, wherein a plurality of the gasket holding holes are disposed to be connected to the gasket guiding holes at the longitudinal first ends of the gasket holding holes, and at least one of intervals from one first end to another first end of the gasket holding holes is made different from an interval from one reference position to another reference position of the corresponding fitting parts of the electromagnetic shielding gasket.

7. The electronic device of claim 3, wherein the first opposing wall further comprises: between the gasket holding hole and the gasket guiding hole of the electronic device body, a guiding part for guiding the fitting part of the electromagnetic shielding gasket from the gasket guiding hole to the gasket holding hole.

8. The electronic device of claim 3, wherein the first opposing wall further comprises: between the gasket holding hole and the gasket guiding hole of the electronic device body, a guiding part for guiding the fitting part of the electromagnetic shielding gasket from the gasket guiding hole to the gasket holding hole; and a reverse checking part for preventing the fitting part of the electromagnetic shielding gasket fitted in the gasket holding hole from reversing to the gasket guiding hole.

9. The electronic device of claim 5, wherein a plurality of the gasket holding holes are disposed to be connected to the gasket guiding holes at the longitudinal first ends of the gasket holding holes, and at least one of intervals from one first end to another first end of the gasket holding holes is made different from an interval from one reference position to another reference position of the corresponding fitting parts of the electromagnetic shielding gasket.

10. The electronic device of claim 5, wherein the first opposing wall further comprises: between the gasket holding hole and the gasket guiding hole of the electronic device body, a guiding part for guiding the fitting part of the electromagnetic shielding gasket from the gasket guiding hole to the gasket holding hole.

* * * * *